US012581780B2

(12) United States Patent
Kim et al.

(10) Patent No.: US 12,581,780 B2
(45) Date of Patent: Mar. 17, 2026

(54) DISPLAY DEVICE

(71) Applicant: LG ELECTRONICS INC., Seoul (KR)

(72) Inventors: Myoungsoo Kim, Seoul (KR); Minwoo Lee, Seoul (KR); Jungsub Kim, Seoul (KR); Junghoon Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 404 days.

(21) Appl. No.: 18/265,172

(22) PCT Filed: Dec. 4, 2020

(86) PCT No.: PCT/KR2020/017633
§ 371 (c)(1),
(2) Date: Jun. 2, 2023

(87) PCT Pub. No.: WO2022/119018
PCT Pub. Date: Jun. 9, 2022

(65) Prior Publication Data
US 2023/0420618 A1 Dec. 28, 2023

(51) Int. Cl.
*H10H 20/85* (2025.01)
*H01L 25/075* (2006.01)
(Continued)

(52) U.S. Cl.
CPC ....... *H10H 20/8506* (2025.01); *H01L 25/167* (2013.01); *H10D 86/441* (2025.01); *H10D 86/60* (2025.01)

(58) Field of Classification Search
CPC ..... H01L 25/167; H01L 25/16; H10D 86/441; H10H 20/857; H10H 20/0364; H10H 20/819; H10H 20/84
See application file for complete search history.

(56) References Cited

U.S. PATENT DOCUMENTS 9,917,226 B1 3/2018 Heine et al.
2001/0031514 A1 10/2001 Smith
(Continued)

FOREIGN PATENT DOCUMENTS

KR 10-2018-0007376 A 1/2018
KR 10-2019-0085892 A 7/2019
(Continued)

OTHER PUBLICATIONS

International Search Report for PCT/KR2020/017633 mailed on Aug. 30, 2021.

*Primary Examiner* — Antonio B Crite
(74) *Attorney, Agent, or Firm* — Birch, Stewart, Kolasch & Birch, LLP

(57) ABSTRACT

The display device includes a substrate, a first wiring line on the substrate, a second wiring line on the substrate, and a first insulating member on the first wiring line and the second wiring line, a blocking member disposed across the first wiring line and the second wiring line, a second insulating member including a plurality of assembly holes, and a plurality of light emitting devices disposed in each of the plurality of assembly holes.

Each of the plurality of assembly holes includes a first region closer to the blocking member and a second region farther than the first region from the blocking member. A part of the blocking member is disposed in the first area of the assembly hole.

20 Claims, 13 Drawing Sheets

(51) Int. Cl.

| | | |
|---|---|---|
| *H01L 25/16* | (2023.01) |
| *H10D 86/40* | (2025.01) |
| *H10D 86/60* | (2025.01) |
| *H10H 20/812* | (2025.01) |
| *H10H 20/819* | (2025.01) |
| *H10H 20/84* | (2025.01) |
| *H10H 20/857* | (2025.01) |

(56)                   References Cited

U.S. PATENT DOCUMENTS

| | | |
|---|---|---|
| 2007/0087472 A1 | 4/2007 | Huber et al. |
| 2018/0019369 A1 | 1/2018 | Cho et al. |
| 2022/0254961 A1 | 8/2022 | Chang et al. |
| 2022/0328335 A1 | 10/2022 | Shim et al. |
| 2022/0375915 A1 | 11/2022 | Kim et al. |
| 2022/0415859 A1 | 12/2022 | Choi et al. |
| 2023/0119947 A1 | 4/2023 | Chang et al. |

FOREIGN PATENT DOCUMENTS

| | | | | |
|---|---|---|---|---|
| KR | 10-2019-0104277 A | 9/2019 | |
| KR | 10-2037226 B1 | 10/2019 | |
| KR | 10-2019-0126260 A | 11/2019 | |
| KR | 10-2020-0026683 A | 3/2020 | |
| KR | 10-2020-0030514 A | 3/2020 | |
| KR | 20200021966 A | * | 3/2020 | ........... H01L 27/156 |

* cited by examiner

FIG. 1

DISPLAY DEVICE

CROSS REFERENCE TO RELATED APPLICATION

This application is the National Phase of PCT International Application No. PCT/KR2020/017633, filed on Dec. 4, 2020, which is hereby expressly incorporated by reference into the present application.

TECHNICAL FIELD

Embodiment relates to a display device.

BACKGROUND ART

A display device uses a self-light emitting device such as a light emitting diode as a light source of a pixel to display a high-definition image. Light emitting diodes exhibit excellent durability even under harsh environmental conditions, and are in the limelight as a light source for next-generation display devices because of their long lifespan and high luminance.

Recently, research is being conducted to manufacture a subminiature light emitting diode using a material having a highly reliable inorganic crystal structure and to use it as a next-generation pixel light source by placing it on a panel of a display device (hereinafter referred to as "display panel").

In order to implement high resolution, the size of pixels is gradually getting smaller, and since a large number of light emitting devices should be aligned in such small-sized pixels, research into the manufacture of ultra-small light emitting diodes as small as micro or nano scale is being actively conducted.

A typical display panel includes millions of pixels. Therefore, since it is very difficult to align light emitting devices in each of millions of small-sized pixels, various studies on arranging light emitting devices in a display panel are being actively conducted.

As the size of light emitting devices decreases, transferring these light emitting devices onto a substrate has become a very important problem. Transfer technologies that have recently been developed include a pick and place process, a laser lift-off method, or a self-assembly method. In particular, a self-assembly method in which a light emitting device is transferred onto a substrate using a magnetic material has recently been in the limelight.

In the self-assembly method, a light emitting device is disposed in each sub-pixel by dropping a liquid droplet containing a light emitting device onto a substrate using an inkjet head device. Since the light emitting devices are randomly dropped on the substrate, some light emitting devices can be correctly assembled between the electrodes while others may not be correctly assembled between the electrodes.

Among the light emitting devices, the p-electrode of some of the light emitting devices is positioned on the first electrode and assembled in alignment, but the p-electrode of other light emitting devices can be positioned on the second electrode and assembled in misalignment. When the p-electrode of the light emitting device is positioned on the second electrode, the light emitting device does not emit light due to a short circuit. Apart from this, some light emitting devices are arranged so that the n-electrode or p-electrode of the light emitting device is not located anywhere between the first electrode and the second electrode, such a light emitting device is not electrically connected to the first electrode or the second electrode and thus does not emit light.

In the prior art, since the assembly direction of the light emitting devices is not controlled, a large number of light emitting devices randomly dropped on the substrate do not contribute to light emission, resulting in a high assembly defect rate and low luminous efficiency and low luminance.

DISCLOSURE

Technical Problem

Embodiments are aimed at solving the foregoing and other problems.

Another object of the embodiment is to provide a display device capable of minimizing an assembly defect rate by controlling an assembly direction of a light emitting device.

Embodiments provide a display device capable of improving light emitting efficiency and luminance by changing the shape of a light emitting device.

Technical Solution

According to one aspect of the embodiment to achieve the above or other object, a display device includes a substrate; a first wiring line on the substrate; a second wiring line on the substrate; a first insulating member on the first wiring line and the second wiring line; a blocking member disposed across the first wiring line and the second wiring line; a second insulating member including a plurality of assembly holes; and a plurality of light emitting devices disposed in each of the plurality of assembly holes. Each of the plurality of assembly holes includes a first area closer to the blocking member and a second area farther from the blocking member than the first area. A part of the blocking member is disposed in the first region of the assembly hole.

Effects of the Invention

Effects of the display device according to the embodiment are described as follows.

According to at least one of the embodiments, as shown in FIGS. 10, 11 and 14 to 16, the assembly direction of the light emitting device 150 can be controlled by using the blocking member 210 on the substrate 200 and the first metal layer and the first and second insulating layers of the light emitting device 150. By controlling the assembly direction, the light emitting device 150 can be assembled in the assembly hole according to the predetermined direction, the number of light emitting devices 150 assembled in the assembly hole 203 according to a predetermined direction can be increased, so that light emitting efficiency and luminance can be dramatically improved.

According to at least one of the embodiments, as shown in FIGS. 12 and 12, the light emitting device 150 can have a plate shape. That is, the plate-type light emitting device 150 can have a major axis along the Y-axis direction and a minor axis along the Z-axis direction. In this case, by maximizing the length of the major axis compared to the length of the minor axis, the luminous efficiency and luminance can be dramatically improved by maximizing the light emitting area. Also, the area of the long side surface can be maximized by reducing the width of the short side surface perpendicular to the Y-axis direction as much as possible and increasing the width of the long side surface perpendicular to the X-axis direction as much as possible. As the long side of the light emitting device 150 is wider, the light emitting device 150 can be assembled more stably in the assembly hole 203 because it comes into surface contact with the corresponding side surface of the light emitting device 150 in the assembly hole 203.

According to at least one of the embodiments, since the light emitting device 150 has a plate shape, as shown in FIG. 16, the lower surface of the light emitting device 150 including the first conductivity-type semiconductor layer and the first metal layer is in surface contact within the assembly hole 203, compared to the cylindrical light emitting device 150, much more stable assembly in the assembly hole 203 is possible.

According to at least one of the embodiments, as shown in FIG. 16, the thickness t2 of the first metal layer of the light emitting device 150 is equal to or greater than the thickness t of the blocking member 210, the upper surface of the light emitting device 150 can be disposed parallel to the upper surface of the substrate 200. Accordingly, since the light emitted from the active layer on the upper surface of the light emitting device 150 has a symmetrical intensity distribution based on a vertical line passing through the active layer, it is possible to secure uniform luminance in each of the sub-pixels PX1, PX2, and PX3 by obtaining a uniform beam angle of light.

A further scope of applicability of the embodiment will become apparent from the detailed description below. However, since various changes and modifications within the spirit and scope of the embodiments can be clearly understood by those skilled in the art, it should be understood that the detailed description and specific embodiments, such as preferred embodiments, are given by way of example only.

DESCRIPTION OF DRAWINGS

FIG. 1 shows a living room of a house in which a display device 100 according to an embodiment is disposed.

4

Figure 17:
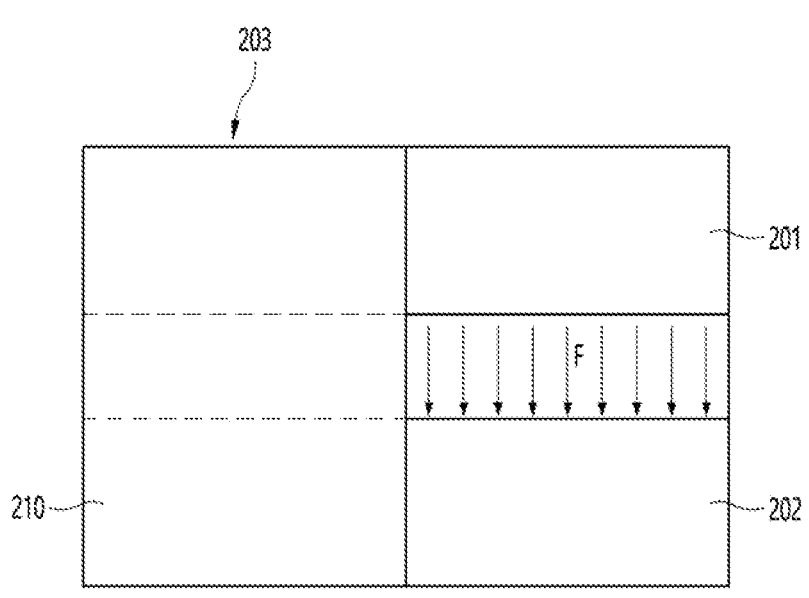

FIG. 17 shows a dielectrophoretic force formed between the first wiring line and the second wiring line in the assembly hole.

Figure 18:
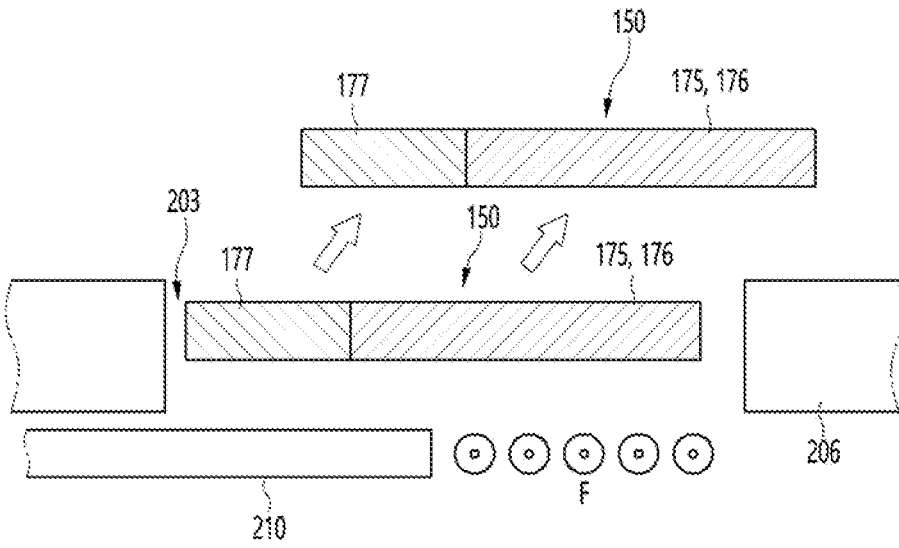

FIG. 18 shows a state in which the light emitting device is not assembled in the assembly hole of FIG. 17.

Figure 19:
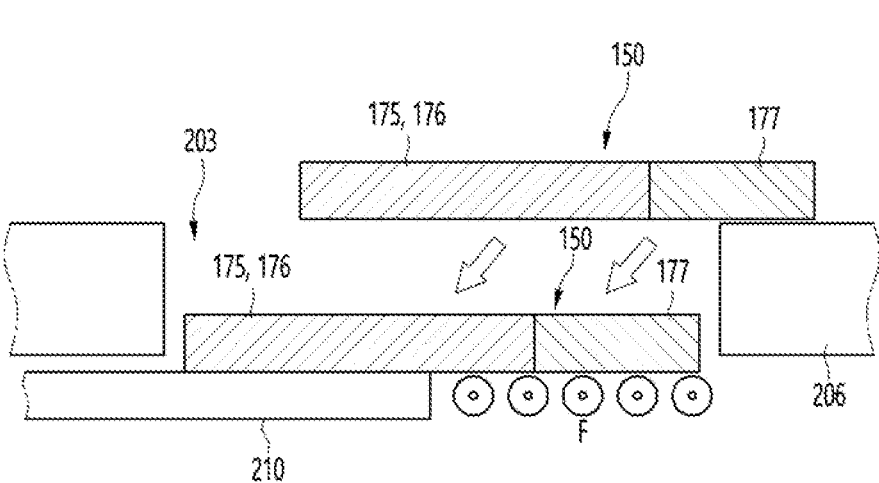

FIG. 19 shows a state in which a light emitting device is assembled in the assembly hole of FIG. 17.

MODE FOR INVENTION

Hereinafter, preferred embodiments of the present invention will be described in detail with reference to the accompanying drawings. However, the technical spirit of the present invention is not limited to some of the described embodiments and can be implemented in various different forms. Within the scope of the technical idea of the present invention, one or more of the components can be selectively combined or replaced between embodiments. Also, terms (including technical and scientific terms) used in the embodiments of the present invention, can be interpreted as meanings that can be generally understood by those of ordinary skill in the art to which the present invention pertains, unless specifically defined and described. Commonly used terms, such as terms defined in a dictionary, can be interpreted in consideration of contextual meanings of related technologies. Also, terms used in the embodiments of the present invention are for describing the embodiments and are not intended to limit the present invention. In this specification, the singular form can also include the plural form unless otherwise specified in the phrase, and can include one or more of all possible combinations of A, B, and C when written as "at least one (or more than one) of B and/or C." Also, terms such as first, second, A, B, (a), and (b) can be used to describe components of an embodiment of the present invention. These terms are only used to distinguish the component from other components, and the term is not limited to the nature, order, or order of the corresponding component. And, when a component is described as being 'connected', 'coupled' or 'connected' to another component, the component is not only directly connected to, coupled to, or connected to the other component, but also include cases where the component is 'connected', 'combined' or 'connected' due to another component between the component and the other component. Also, when it is described as being formed or disposed "on (above) or below (below)" of each component, top (above) or bottom (bottom) includes not only a case where two components are in direct contact with each other, but also a case where one or more other components are formed or disposed between the two components. Also, when expressed as "up (up) or down (down)", it can include the meaning of not only the upward direction but also the downward direction based on one component.

The display device described in this specification can include a mobile phone, a smart phone, a laptop computer, a Digital broadcasting terminals, a personal digital assistants (PDA), a portable multimedia player (PMP), a navigation, a slate PC, a tablet PC, an ultra-book, a digital TV, a desktop computer, etc. However, the configuration according to the embodiment described in the present specification can be applied to a device capable of displaying even a new product form to be developed later.

Hereinafter, a light emitting device according to an embodiment and a display device including the light emitting device will be described.

Figure 1:
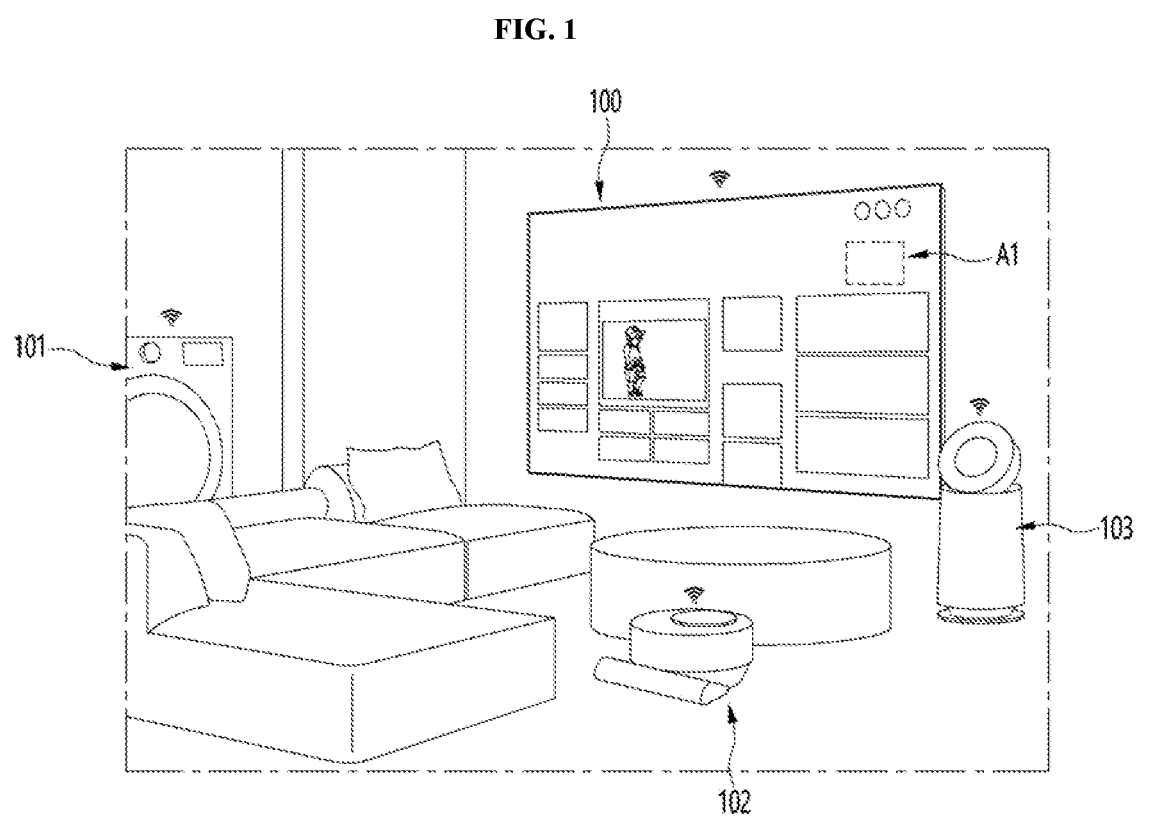

FIG. 1 shows a living room of a house in which a display device 100 according to an embodiment is disposed.

The display device 100 of the embodiment can display the status of various electronic products such as the washing machine 10, the robot cleaner 20, and the air purifier 30 and can communicate with each electronic product based on IOT and can control each electronic product based on user's setting data.

The display device 100 according to the embodiment can include a flexible display fabricated on a thin and flexible substrate. The flexible display can be bent or rolled like paper while maintaining characteristics of a conventional flat panel display.

In the flexible display, visual information can be implemented by independently controlling light emission of unit pixels arranged in a matrix form. The unit pixel means a minimum unit for implementing one color. A unit pixel of the flexible display can be implemented by a semiconductor light emitting device. In the embodiment, the semiconductor light emitting device can be a Micro-LED, but is not limited thereto.

Figure 2:
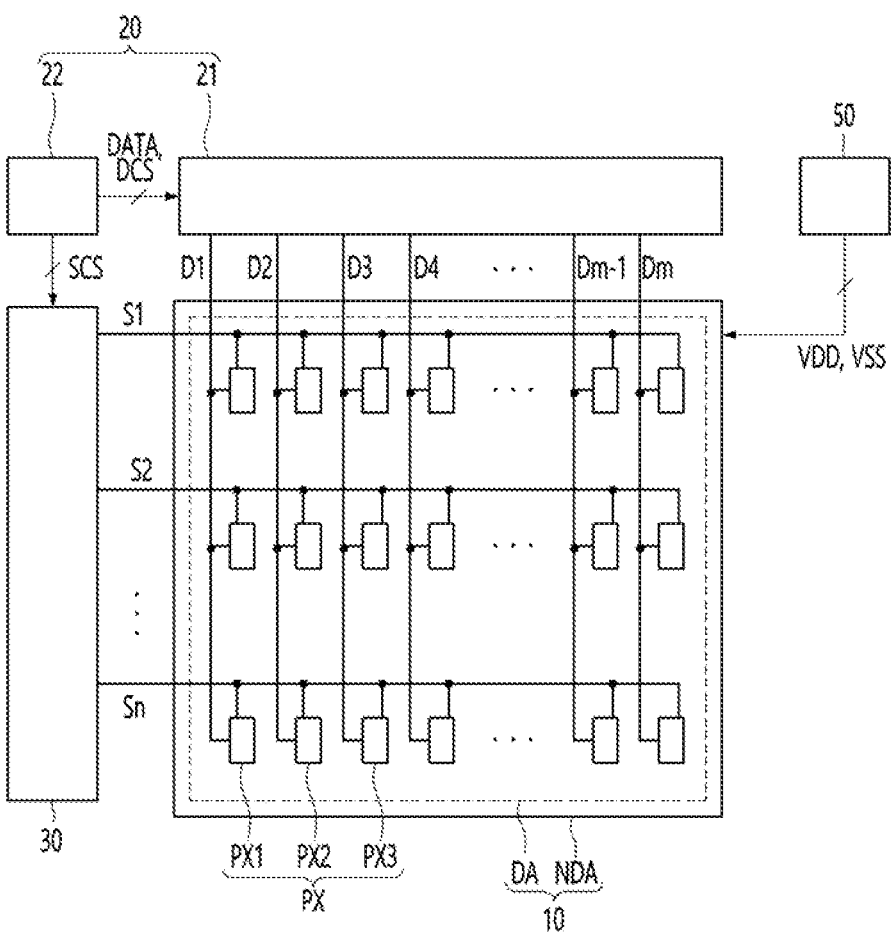
FIG. 2 is a schematic block diagram of a display device according to an exemplary embodiment.
Figure 3:
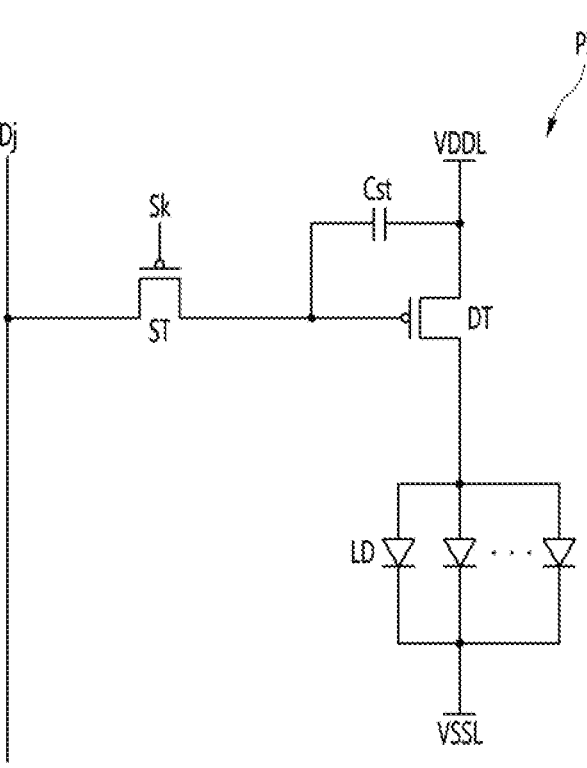
FIG. 3 is a circuit diagram showing an example of a pixel of FIG. 2.

FIG. 2 is a block diagram schematically illustrating a display device according to an exemplary embodiment, and FIG. 3 is a circuit diagram illustrating an example of a pixel of FIG. 2.

Referring to FIGS. 2 and 3, the display device according to the embodiment can include a display panel 10, a driving circuit 20, a scan driving unit 30, and a power supply circuit 50.

Specifically, the display device 100 can drive a clock in an active matrix (AM) method or a passive matrix (PM) method.

The driving circuit 20 can include a data driver 21 and a timing controller 22.

The display panel 10 can have a rectangular shape on a plane. The planar shape of the display panel 10 is not limited to a rectangle, and can be formed into other polygonal, circular or elliptical shapes. At least one side of the display panel 10 can be formed to be bent with a predetermined curvature.

The display panel 10 can be divided into a display area DA and a non-display area NDA disposed around the display area DA. The display area DA is an area in which pixels PX are formed to display an image. The display panel 10 can include data lines (D1 to Dm, m is an integer greater than or equal to 2), scan lines crossing the data lines D1 to Dm (S1 to Sn, n is an integer greater than or equal to 2), the high-potential voltage line VDDL supplied with the high-voltage, the low-potential voltage line VSSL supplied with the low-potential voltage, and the pixels PX connected to the data lines D1 to Dm and the scan lines S1 to Sn can be included.

Each of the pixels PX can include a first sub-pixel PX1, a second sub-pixel PX2, and a third sub-pixel PX3. The first sub-pixel PX1 can emit a first color light, the second sub-pixel PX2 can emit a second color light, and the third sub-pixel PX3 can emit a third color light. The first color light can be red light, the second color light can be green light, and the third color light can be blue light, but is not limited thereto. Also, although it is illustrated that each of the pixels PX can include three sub-pixels in FIG. 2, the present invention is not limited thereto. That is, each of the pixels PX can include four or more sub-pixels.

Each of the first sub-pixel PX1, the second sub-pixel PX2, and the third sub-pixel PX3 can connected to at least one of the data lines D1 to Dm, and at least one of the scan lines S1 to Sn, and a high potential voltage line VDDL. As shown in FIG. 3, the first sub-pixel PX1 can include the light emitting devices LD, plurality of transistors for supplying current to the light emitting devices LD, and at least one capacitor.

Each of the light emitting devices LD can be an inorganic light emitting diode including a first electrode, an inorganic semiconductor, and a second electrode. Here, the first electrode can be an anode electrode, and the second electrode can be a cathode electrode.

The plurality of transistors as shown in FIG. 3 can include a driving transistor DT for supplying current to the light emitting devices LD, and a scan transistor ST for supplying a data voltage to the gate electrode of the driving transistor DT. The driving transistor DT can include a gate electrode connected to the source electrode of the scan transistor ST, a source electrode connected to a high potential voltage line VDDL to which a high potential voltage is applied, and a drain electrode connected to first electrodes of the light emitting devices LD. The scan transistor ST can include a gate electrode connected to the scan line Sk, where k is an integer satisfying $1 \le k \le n$, a source electrode connected to the gate electrode of the driving transistor DT, and a drain electrode connected to data lines Dj, where j is integer satisfying $1 \le j \le m$.

The capacitor Cst is formed between the gate electrode and the source electrode of the driving transistor DT. The storage capacitor Cst stores a difference voltage between the gate voltage and the source voltage of the driving transistor DT.

The driving transistor DT and the scan transistor ST can be formed of a thin film transistor. Also, although the driving transistor DT and the scan transistor ST have been mainly described in FIG. 3 as being formed of a P-type MOSFET (Metal Oxide Semiconductor Field Effect Transistor), the present invention is not limited thereto. The driving transistor DT and the scan transistor ST can be formed of an N-type MOSFET. In this case, the positions of the source electrode and the drain electrode of each of the driving transistor DT and the scan transistor ST can be changed.

Also, in FIG. 3 has been illustrated each of the first sub-pixel PX1, the second sub-pixel PX2, and the third sub-pixel PX3 can include one driving transistor DT, one scan transistor ST, and 2T1C (2 Transistor-1 capacitor) having a capacitor Cst, but the present invention is not limited thereto. Each of the first sub-pixel PX1, the second sub-pixel PX2, and the third sub-pixel PX3 can include a plurality of scan transistors ST and a plurality of capacitors Cst.

Since the second sub-pixel PX2 and the third sub-pixel PX3 can be expressed with substantially the same circuit diagram as the first sub-pixel PX1, a detailed description thereof will be omitted.

The driving circuit 20 outputs signals and voltages for driving the display panel 10. To this end, the driving circuit 20 can include a data driver 21 and a timing controller 22.

The data driver 21 receives digital video data DATA and a source control signal DCS from the timing controller 22. The data driver 21 converts the digital video data DATA into analog data voltages according to the source control signal DCS and supplies them to the data lines D1 to Dm of the display panel 10.

The timing controller 22 receives digital video data DATA and timing signals from the host system. The timing signals can include a vertical sync signal, a horizontal sync signal, a data enable signal, and a dot clock. The host system can be an application processor of a smartphone or tablet PC, a monitor, or a system-on-chip of a TV.

The timing controller 22 generates control signals for controlling operation timings of the data driver 21 and the scan driver 30. The control signals can include a source control signal DCS for controlling the operation timing of the data driver 21 and a scan control signal SCS for controlling the operation timing of the scan driver 30.

The driving circuit 20 can be disposed in the non-display area NDA provided on one side of the display panel 10. The driving circuit 20 can be formed of an integrated circuit (IC) and mounted on the display panel 10 using a chip on glass (COG) method, a chip on plastic (COP) method, or an ultrasonic bonding method, but the present invention is not limited to this. For example, the driving circuit 20 can be mounted on a circuit board (not shown) instead of the display panel 10.

The data driver 21 is mounted on the display panel 10 using a chip on glass (COG) method, a chip on plastic (COP) method, or an ultrasonic bonding method, and the timing controller 22 can be mounted on a circuit board.

The scan driver 30 receives the scan control signal SCS from the timing controller 22. The scan driver 30 generates scan signals according to the scan control signal SCS and supplies them to the scan lines S1 to Sn of the display panel 10. The scan driver 30 can include a plurality of transistors and can be formed in the non-display area NDA of the display panel 10. Also, the scan driver 30 can be formed of an integrated circuit, and in this case, can be mounted on a gate flexible film attached to the other side of the display panel 10.

The circuit board can be attached to pads provided on one edge of the display panel using an anisotropic conductive film. Due to this, the lead lines of the circuit board can be electrically connected to the pads. The circuit board can be a flexible printed circuit board, a printed circuit board, or a flexible film such as a chip on film. The circuit board can be bent under the display panel 10. Accordingly, one side of the circuit board can be attached to one edge of the display panel 10 and the other side can be disposed below the display panel 10 and connected to a system board on which a host system is mounted.

The power supply circuit 50 can generate voltages necessary for driving the display panel 10 from the main power applied from the system board and supply them to the display panel 10. For example, the power supply circuit 50 generates a high potential voltage VDD and a low potential voltage VSS for driving the light emitting devices LD of the display panel 10 from the main power supply, and can supply the high potential voltage line VDDL and the low potential voltage line VSSL of the display panel 10. Also, the power supply circuit 50 can generate and supply driving voltages for driving the driving circuit 20 and the scan driving unit 30 from the main power.

Figure 4:
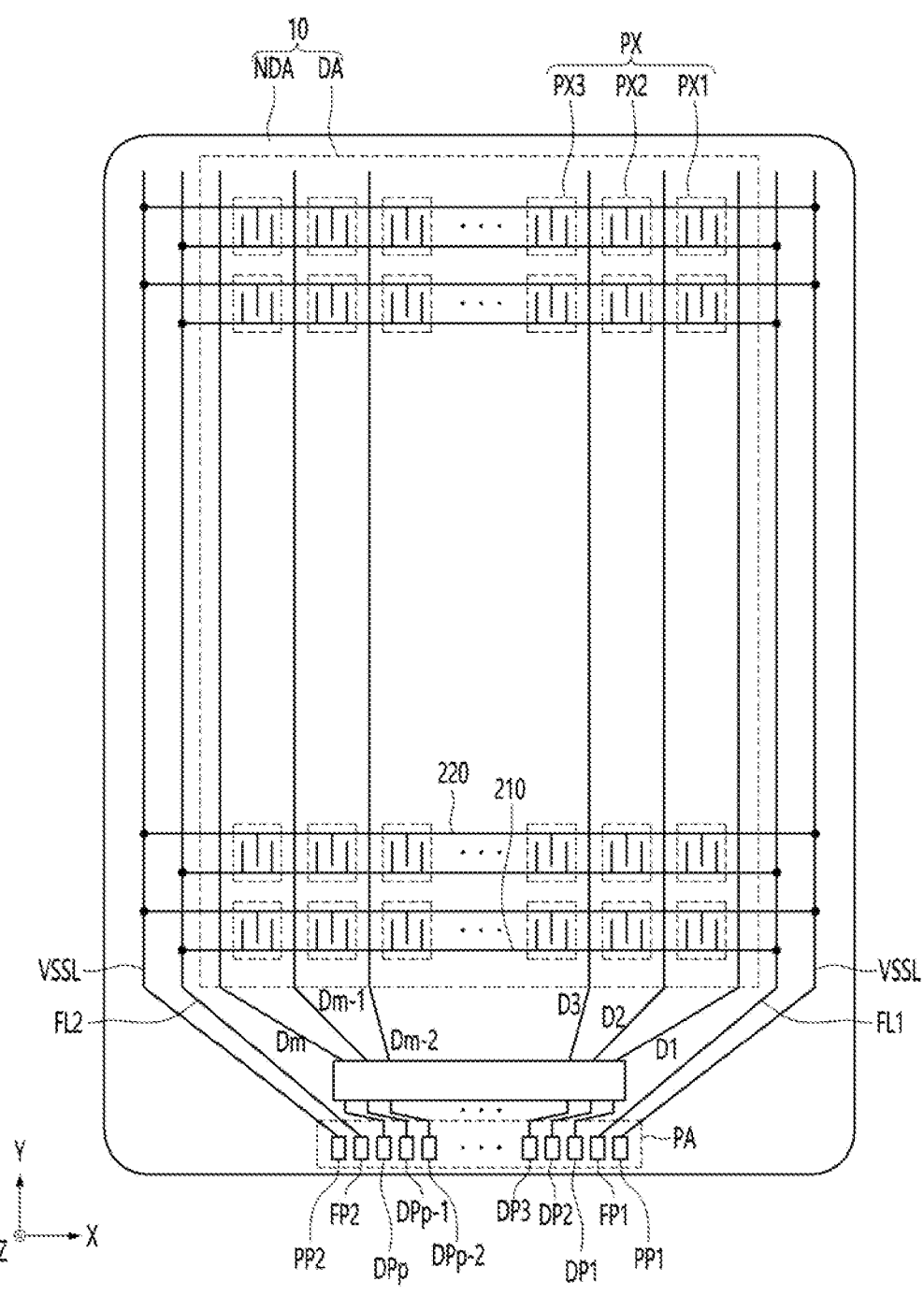
FIG. 4 is a plan view showing the display panel of FIG. 2 in detail.

FIG. 4 is a plan view showing the display panel of FIG. 2 in detail. In FIG. 4, only data pads (DP1 to DPp, where p is an integer equal to or greater than 2), floating pads FD1 and FD2, power pads PP1 and PP2, floating lines FL1 and FL2, low potential voltage line VSSL, data lines D1 to Dm, first pad electrodes 210 and second pad electrodes 220 are shown for convenience of description.

Referring to FIG. 4, data lines D1 to Dm, first pad electrodes 210, second pad electrodes 220, and pixels PX can be disposed in the display area DA of the display panel 10.

The data lines D1 to Dm can extend long in the second direction (Y-axis direction). One sides of the data lines D1 to Dm can be connected to the driving circuit 20. For this reason, the data voltages of the driving circuit 20 can be applied to the data lines D1 to Dm.

The first pad electrodes 210 can be spaced apart from each other at predetermined intervals in the first direction (X-axis direction). For this reason, the first pad electrodes 210 may not overlap the data lines D1 to Dm. Among the first pad electrodes 210, the first pad electrodes 210 disposed on the right edge of the display area DA can be connected to the first floating line FL1 in the non-display area NDA. Among the first pad electrodes 210, the first pad electrodes 210 disposed on the left edge of the display area DA can be connected to the second floating line FL2 in the non-display area NDA.

Each of the second pad electrodes 220 can extend long in the first direction (X-axis direction). For this reason, the second pad electrodes 220 can overlap the data lines D1 to Dm. Also, the second pad electrodes 220 can be connected to the low potential voltage line VSSL in the non-display area NDA. For this reason, the low potential voltage of the low potential voltage line VSSL can be applied to the second pad electrodes 220.

Each of the pixels PX can include a first sub-pixel PX1, a second sub-pixel PX2, and a third sub-pixel PX3. The first sub-pixel PX1, the second sub-pixel PX2, and the third sub-pixel PX3 of each of the pixels PX can be disposed in regions defined in a matrix form by the first pad electrodes 210, the second electrode, and the data lines D1 to Dm. Although FIG. 4 illustrates that the pixel PX includes three sub-pixels, it is not limited thereto, and each of the pixels PX can include four or more sub-pixels.

The first sub-pixel PX1, the second sub-pixel PX2, and the third sub-pixel PX3 of each of the pixels PX can be disposed in the first direction (X-axis direction), but is not limited thereto. That is, the first sub-pixel PX1, the second sub-pixel PX2, and the third sub-pixel PX3 of each of the pixels PX can be disposed in the second direction (Y-axis direction), can be disposed in a zigzag shape, or can be disposed in various other shapes.

The first sub-pixel PX1 emits light of a first color, the second sub-pixel PX2 emits light of a second color, and the third sub-pixel PX3 can emit third color light. The first color light can be red light, the second color light can be green light, and the third color light can be blue light, but are not limited thereto.

In the non-display area NDA of the display panel 10, a pad part PA including data pads DP1 to DPp, floating pads FD1 and FD2, power pads PP1 and PP2, the driving circuit 20, the first floating line FL1, the second floating line FL2, and the low potential voltage line VSSL can be disposed.

The pad part PA including data pads DP1 to DPp, floating pads FD1 and FD2, and power pads PP1 and PP2 can be disposed on one edge of the display panel 10, for example, on the lower edge. The data pads DP1 to DPp, the floating pads FD1 and FD2, and the power pads PP1 and PP2 can be disposed side by side in the first direction (X-axis direction) of the pad part PA.

A circuit board can be attached to the data pads DP1 to DPp, the floating pads FD1 and FD2, and the power pads PP1 and PP2 using an anisotropic conductive film. Accordingly, the circuit board, the data pads DP1 to DPp, the floating pads FD1 and FD2, and the power pads PP1 and PP2 can be electrically connected.

The driving circuit 20 can be connected to the data pads DP1 to DPp through the link lines LL. The driving circuit 20 can receive digital video data DATA and timing signals through the data pads DP1 to DPp. The driving circuit 20 can convert the digital video data DATA into analog data voltages and supply them to the data lines D1 to Dm of the display panel 10.

The low potential voltage line VSSL can be connected to the first power pad PP1 and the second power pad PP2 of the pad part PA. The low potential voltage line VSSL can extend long in the second direction (Y-axis direction) in the non-display area NDA outside the left and right outside of the display area DA. The low potential voltage line VSSL can be connected to the second pad electrode 220. Due to this, the low potential voltage of the power supply circuit 50 can be applied to the second pad electrode 220 through the circuit board, the first power pad PP1, the second power pad PP2, and the low potential voltage line VSSL.

The first floating line FL1 can be connected to the first floating pad FD1 of the pad part PA. The first floating line FL1 can extend long in the second direction (Y-axis direction) in the non-display area NDA outside the left and right sides of the display area DA.

The first floating pad FD1 and the first floating line FL1 can be dummy pads and dummy lines to which no voltage is applied.

The second floating line FL2 can be connected to the second floating pad FD2 of the pad part PA. The first floating line FL1 can extend long in the second direction (Y-axis direction) in the non-display area NDA outside the left and right sides of the display area DA.

The second floating pad FD2 and the second floating line FL2 can be dummy pads and dummy lines to which no voltage is applied.

Meanwhile, since the light emitting devices (300 in FIG. 5) have a very small size, it is very difficult to mount the first sub-pixel PX1, the second sub-pixel PX2, and the third sub-pixel PX3 of the pixels PX.

To solve this problem, an alignment method using a dielectrophoresis method was proposed.

That is, during the manufacturing process, in order to align the light emitting devices 300, an electric field can be formed in each of the first sub-pixel PX1, the second sub-pixel PX2, and the third sub-pixel PX3 of the pixels PX. Specifically, the light emitting devices 300 can be aligned by applying a dielectrophoretic force to the light emitting devices 300 using a dielectrophoresis method during a manufacturing process.

However, it is difficult to apply a ground voltage to the first pad electrodes 210 by driving the thin film transistors during the manufacturing process.

Therefore, in the completed display device, the first pad electrodes 210 are spaced apart at predetermined intervals in the first direction (X-axis direction), but during the manufacturing process, the first pad electrodes 210 may not be disconnected in the first direction (X-axis direction) and can be extended and disposed.

For this reason, during the manufacturing process, the first pad electrodes 210 can be connected to the first floating line FL1 and the second floating line FL2. Therefore, the first pad electrodes 210 can receive a ground voltage through the first floating line FL1 and the second floating line FL2. Therefore, after aligning the light emitting devices 300 using a dielectrophoresis method during the manufacturing process, by disconnecting the first pad electrodes 210, the first pad electrodes 210 can be spaced apart from each other at predetermined intervals in the first direction (X-axis direction).

Meanwhile, the first floating line FL1 and the second floating line FL2 are lines for applying a ground voltage during a manufacturing process, and no voltage can be applied in a completed display device. Alternatively, a ground voltage can be applied to the first floating line FL1 and the second floating line FL2 to prevent static electricity in the finished display device.

Figure 5:
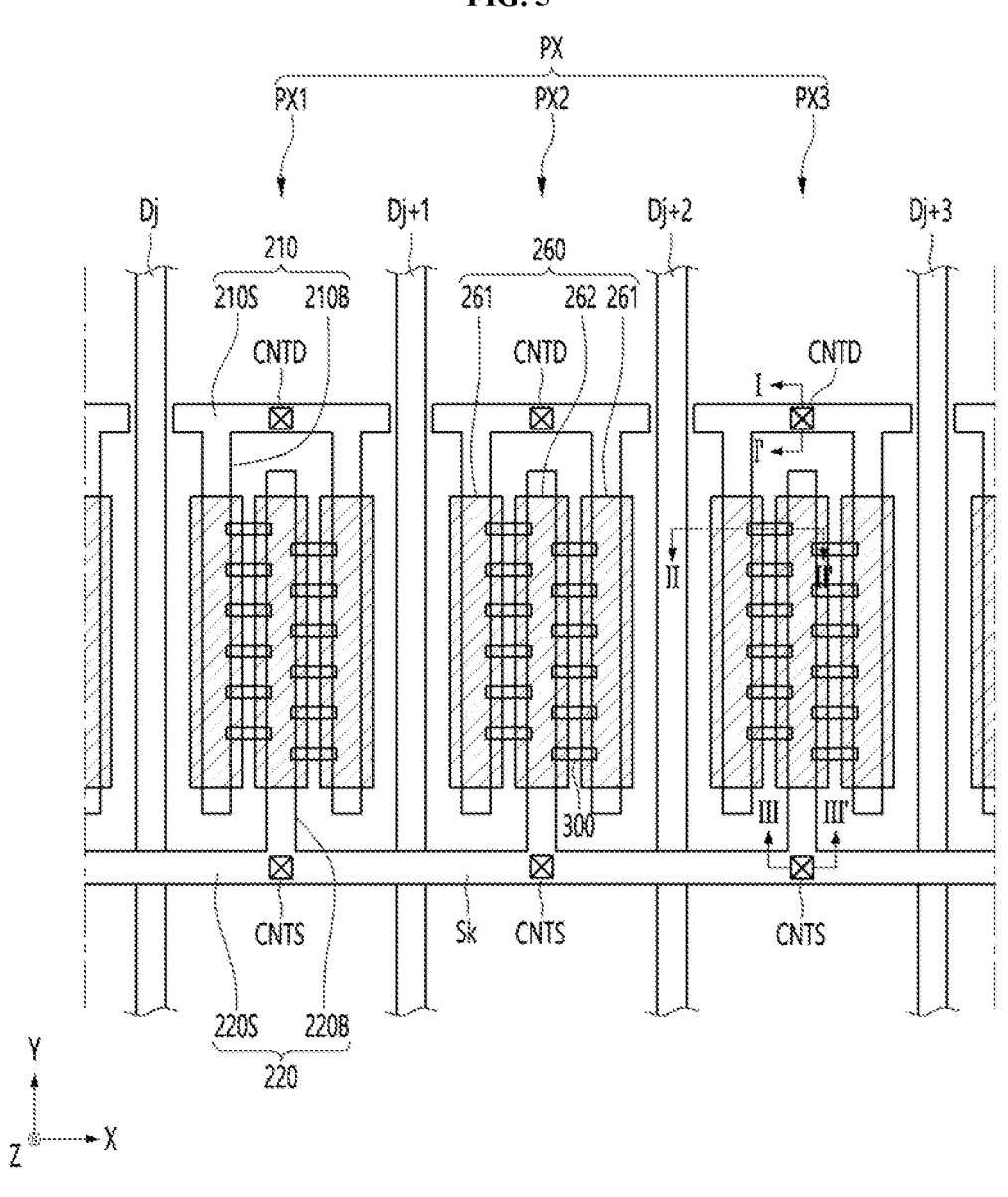
FIG. 5 is a plan view showing pixels in the display area of FIG. 4 in detail.

FIG. 5 is a plan view showing pixels in the display area of FIG. 4 in detail.

Referring to FIG. 5, the pixel PX can include a first sub-pixel PX1, a second sub-pixel PX2, and a third sub-pixel PX3. The first sub-pixel PX1, the second sub-pixel PX2, and the third sub-pixel PX3 of each of the pixels PX can be arranged in a matrix form in regions defined by an intersection structure of scan lines Sk and data lines Dj, Dj+1, Dj+2, and Dj+3.

The scan lines (Sk) are disposed to extend long in the first direction (X-axis direction). The data lines Dj, Dj+1, Dj+2, and Dj+3 can be disposed to extend in a second direction (Y-axis direction) crossing the first direction (X-axis direction).

Each of the first sub-pixel PX1, the second sub-pixel PX2, and the third sub-pixels PX3 can include a first pad electrode 210, a second pad electrode 220 and a plurality of light emitting devices 300. The first pad electrode 210 and the second pad electrode 220 can be electrically connected to the light emitting devices 300 and can receive voltages so that the light emitting devices 300 emit light.

The first pad electrode 210 of any one of the first sub-pixel PX1, the second sub-pixel PX2, and the third sub-pixel PX3 can be spaced apart from the first pad electrode 210 of an adjacent sub-pixel. For example, the first pad electrode 210 of the first sub-pixel PX1 can be spaced apart from the first pad electrode 210 of the second sub-pixel PX2 adjacent thereto. Also, the first pad electrode 210 of the second sub-pixel PX2 can be spaced apart from the first pad electrode 210 of the third sub-pixel PX3 adjacent thereto. Also, the first pad electrode 210 of the third sub-pixel PX3 can be spaced apart from the first pad electrode 210 of the first sub-pixel PX1 adjacent thereto.

On the other hand, the second pad electrode 220 of any one of the first sub-pixel PX1, the second sub-pixel PX2, and the third sub-pixel PX3 can be connected to the second pad electrode 220 of an adjacent sub-pixel. For example, the second pad electrode 220 of the first sub-pixel PX1 can be connected to the second electrode 210 of the adjacent second sub-pixel PX2. Also, the second pad electrode 220 of the second sub-pixel PX2 can be connected to the second pad electrode 220 of the third sub-pixel PX3 adjacent thereto. Also, the second pad electrode 220 of the third sub-pixel PX3 can be connected to the second pad electrode 220 of the first sub-pixel PX1 adjacent thereto.

Also, during the manufacturing process, the first pad electrode 210 and the second pad electrode 220 can be used to form an electric field in each of the first sub-pixel PX1, the second sub-pixel PX2, and the third sub-pixel PX3 to align the light emitting device 300. Specifically, the light emitting devices 300 can be aligned by applying a dielectrophoretic force to the light emitting devices 300 using a dielectrophoresis method during the manufacturing process. An electric field is formed by the voltage applied to the first pad electrode 210 and the second pad electrode 220, and a capacitance is formed by the electric field, so that a dielectrophoretic force can be applied to the light emitting device 300.

The first pad electrode 210 can be an anode electrode connected to the second conductive semiconductor layer of the light emitting devices 300, and the second pad electrode 220 can be a cathode electrode connected to the first conductivity-type semiconductor layer of the light emitting devices 300. The first conductivity-type semiconductor layer of the light emitting devices 300 can be an n-type semiconductor layer, and the second conductivity-type semiconductor layer can be a p-type semiconductor layer. However, the present invention is not limited thereto, and the first pad electrode 210 can be a cathode electrode and the second pad electrode 220 can be an anode electrode.

The first pad electrode 210 can include a first electrode stem 210S extending and extending in a first direction (X-axis direction) and at least one first electrode branch portion 210B branched from the first electrode stem portion 210S in a second direction (Y-axis direction). The second pad electrode 220 can include a second electrode stem 220S extending and extending in the first direction (X-axis direction) and at least one second electrode branch portion 220B branched in a second direction (Y-axis direction) from the second electrode stem portion 220S.

The first electrode stem portion 210S can be electrically connected to the thin film transistor 120 through the first electrode contact hole CNTD.

Due to this, the first electrode stem 210S can be applied with a predetermined driving voltage by the thin film transistor 120. The thin film transistor 120 to which the first electrode stem 210S is connected can be the driving transistor DT shown in FIG. 3.

The second electrode stem 220S can be electrically connected to the low potential auxiliary wire 161 through the second electrode contact hole CNTS.

Due to this, the second electrode stem portion 220S can receive the low potential voltage of the low potential auxiliary wire 161. FIG. 5 illustrates that the second electrode stem 220S is connected to the low potential auxiliary wire 161 through the second electrode contact hole CNTS in each of the first sub-pixel PX1, the second sub-pixel PX2 and the third sub-pixels PX3 of the pixel PX, but is not limited to this. For example, the second electrode stem 220S can be connected to the low potential auxiliary wire 161 through the second electrode contact hole CNTS in any one sub-pixel among the first sub-pixel PX1, the second sub-pixel PX2, and the third sub-pixel PX3.

The first electrode stem 210S of one sub-pixel can be disposed parallel to the first electrode stem portion 210S of a neighboring sub-pixel in a first direction (X-axis direction) in a first direction (X-axis direction). For example, the first electrode stem 210S of the first sub-pixel PX1 can be disposed parallel to the first electrode stem 210S of the second sub-pixel PX2 in the first direction (X-axis direction), the first electrode stem 210S of the second sub-pixel PX2 is disposed parallel to the first electrode stem 210S of the third sub-pixel PX3 in a first direction (X-axis direction) and the first electrode stem 210S of the third sub-pixel PX3 can be disposed parallel to the first electrode stem 210S of the first sub-pixel PX1 in the first direction (X-axis direction). This is because the first electrode stems 210S were connected as one during the manufacturing process, and then disconnected through a laser process after the light emitting devices 300 were aligned.

The second electrode branch 220B can be disposed between the first electrode branch 210B. The first electrode branch portions 210B can be symmetrically disposed with respect to the first electrode branch portion 220B. In FIG. 5, each of the first sub-pixel PX1, the second sub-pixel PX2, and the third sub-pixel PX3 of the pixel PX includes two first electrode branch portions 220B, but the present invention is not limited to this. For example, each of the first sub-pixel PX1, the second sub-pixel PX2, and the third sub-pixel PX3 of the pixel PX can include three or more first electrode branches 220B.

Also, FIG. 5 illustrates that each of the first sub-pixel PX1, the second sub-pixel PX2, and the third sub-pixel PX3 of the pixel PX includes one second electrode branch 220B, but the present invention is not limited to this. For example, when each of the first sub-pixel PX1, the second sub-pixel PX2, and the third sub-pixel PX3 of the pixel PX includes a plurality of second electrode branch portions 220B. The first electrode branch 210B can be disposed between the second electrode branch 220B. That is, in each of the first sub-pixel PX1, the second sub-pixel PX2, and the third sub-pixel PX3 of the pixel PX, the first electrode branch 210B, the second electrode branch 220B, the first electrode branch 210B, and the second electrode branch 220B can be sequentially arranged in the first direction (X-axis direction).

The plurality of light emitting devices 300 can be disposed between the first electrode branch 210B and the second electrode branch 220B. One end of at least one light emitting device 300 among the plurality of light emitting devices 300 is disposed to overlap the first electrode branch 210B, and the other end is disposed to overlap the second electrode branch 220B. A second conductivity-type semiconductor layer, which is a p-type semiconductor layer, can be disposed at one end of the plurality of light emitting devices 300, and a first conductivity-type semiconductor layer, which is an n-type semiconductor layer, can be disposed at the other end, but the present invention is not limited to this. For example, a first conductivity-type semiconductor layer, which is an n-type semiconductor layer, can be disposed at one end of the plurality of light emitting devices 300, and a second conductivity-type semiconductor layer, which is a p-type semiconductor layer, can be disposed at the other end.

The plurality of light emitting devices 300 can be disposed substantially parallel to each other in the first direction (X-axis direction). The plurality of light emitting devices 300 can be spaced apart from each other in the second direction (Y-axis direction). In this case, the spacing between the plurality of light emitting devices 300 can be different from each other. For example, some of the plurality of light emitting devices 300 can be adjacently disposed to form one group, and the remaining light emitting devices 300 can be adjacently disposed to form another group.

Connection electrodes 260 can be disposed on the first electrode branch 210B and the second electrode branch 220B, respectively. The connection electrodes 260 can be disposed to extend long in the second direction (Y-axis direction) and spaced apart from each other in the first direction (X-axis direction). The connection electrode 260 can be connected to one end of at least one light emitting device 300 among the light emitting devices 300. The connection electrode 260 can be connected to the first pad electrode 210 or the second pad electrode 220.

The connection electrode 260 can include a first connection electrode 261 disposed on the first electrode branch 210B and connected to one end of at least one of the light emitting devices 300 and a second connection electrode 262 disposed on the second electrode branch 220B and connected to one end of at least one light emitting device 300 of the light emitting devices 300. Due to this, the first connection electrode 261 serves to electrically connect the plurality of light emitting devices 300 to the first pad electrode 210, and the second connection electrode 262 serves to electrically connect the plurality of light emitting devices 300 to the second pad electrode 220.

The width of the first connection electrode 261 in the first direction (X-axis direction) can be greater than the width of the first electrode branch 210B in the first direction (X-axis direction). Also, the width of the second connection electrode 262 in the first direction (X-axis direction) can be greater than the width of the second electrode branch 220B in the first direction (X-axis direction).

For example, each end of the light emitting device 300 is disposed on the first electrode branch 210B of the first pad electrode 210 and the second electrode branch 220B of the second pad electrode 220, but due to the insulating layer (not shown) formed on the first pad electrode 210 and the second pad electrode 220, the light emitting device 300 may not be electrically connected to the first pad electrode 210 and the second pad electrode 220. Accordingly, portions of the side surface and/or top surface of the light emitting device 300 can be electrically connected to the first connection electrode 261 and the second connection electrode 262, respectively.

Figures 6, 7:
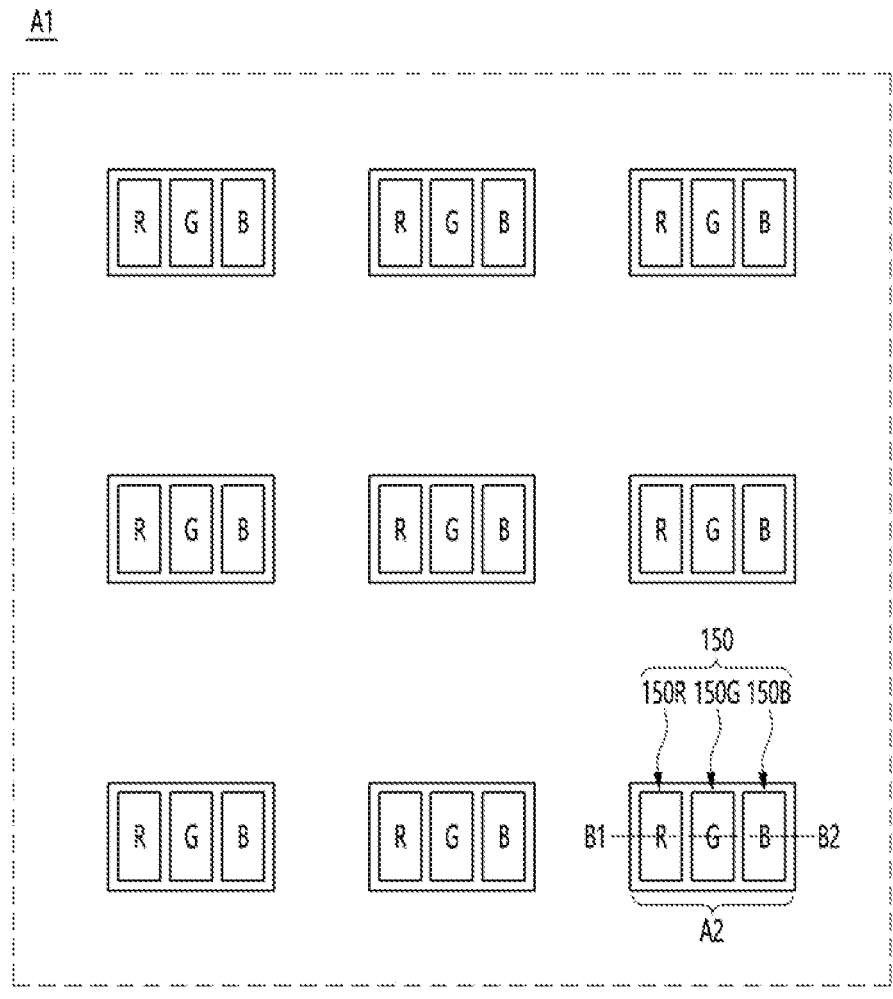
FIG. 6 is an enlarged view of the first panel area in the display device of FIG.
FIG. 7 is an enlarged view of area A2 of FIG. 6.

FIG. 6 is an enlarged view of a first panel area in the display device of FIG. 1.

Referring to FIG. 6, the display device 100 of the embodiment can be manufactured by mechanically and electrically connecting a plurality of panel areas such as the first panel area A1 by tiling.

The first panel area A1 can include a plurality of light emitting devices 150 arranged for each unit pixel (PX in FIG. 2). The light emitting device 150 can be the light emitting device 300 of FIG. 5.

The light emitting device 150 can include, for example, a red light emitting device 150R, a green light emitting device 150G, and a blue light emitting device 150B. For example, the unit pixel PX can include a first sub-pixel PX1, a second sub-pixel PX2, and a third sub-pixel PX3. For example, a plurality of red light emitting devices 150R are disposed in the first sub-pixel PX1, a plurality of green light emitting devices 150G can be disposed in the second sub-pixel PX2, and a plurality of blue light emitting devices 150B can be disposed in the third sub-pixel PX3. The unit pixel PX can further include a fourth sub-pixel in which no light emitting device is disposed, but is not limited thereto.

FIG. 7 is an enlarged view of area A2 of FIG. 6.

Referring to FIG. 7, a display device 100 according to an exemplary embodiment can include a substrate 200, wire electrodes 201 and 202, an insulating layer 206, and a plurality of light emitting devices 150.

The wiring electrode can include a first wiring electrode 201 and a second wiring electrode 202 spaced apart from each other.

The light emitting device 150 can include a red light emitting device 150R, a green light emitting device 150G, and a blue light emitting device 150B0 to form a sub-pixel, but is not limited thereto, and the light emitting device 150 can implement red and green colors by including a red phosphor and a green phosphor, respectively.

The substrate 200 can be formed of glass or polyimide. Also, the substrate 200 can include a flexible material such as polyethylene naphthalate (PEN) or polyethylene terephthalate (PET). Also, the substrate 200 can be a transparent material, but is not limited thereto.

The insulating layer 130 can include an insulating and flexible material such as polyimide, PEN, or PET, and can be formed integrally with the substrate 200 to form a single substrate.

The insulating layer 130 can be a conductive adhesive layer having adhesiveness and conductivity, and the conductive adhesive layer can have flexibility and thus enable a flexible function of the display device. For example, the insulating layer 130 can be an anisotropy conductive film (ACF) or a conductive adhesive layer such as an anisotropic conductive medium or a solution containing conductive particles. The conductive adhesive layer can be a layer that is electrically conductive in a direction perpendicular to the thickness but electrically insulating in a direction horizontal to the thickness.

The insulating layer 130 can include an assembly hole 203 into which the light emitting device 150 is inserted. Therefore, during self-assembly, the light emitting device 150 can be easily inserted into the assembly hole 203 of the insulating layer 130.

Figures 8, 9:
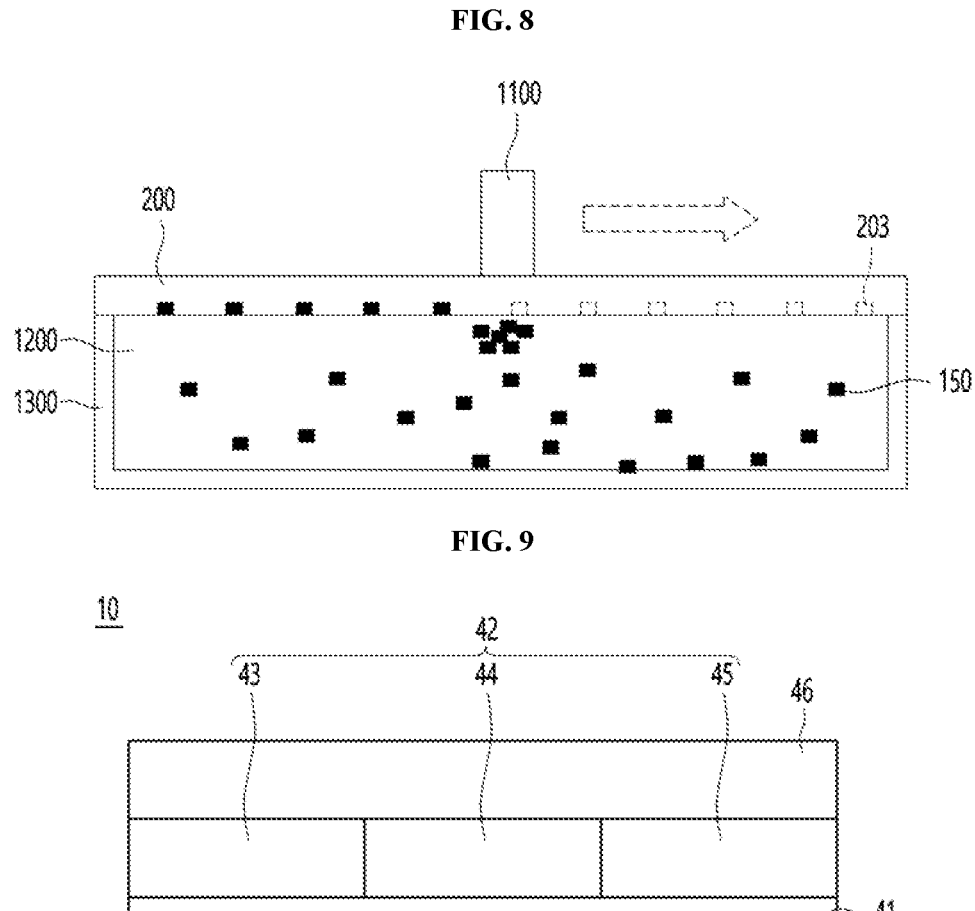
FIG. 8 is a view showing an example in which a light emitting device according to an embodiment is assembled to a substrate by a self-assembly method.
FIG. 9 is a schematic cross-sectional view of the display panel of FIG. 2.

FIG. 8 is a diagram illustrating an example in which a light emitting device according to an embodiment is assembled to a substrate by a self-assembly method.

Referring to FIG. 8, an example in which the light emitting device 150R according to the embodiment is assembled to the substrate 200 by a self-assembly method using an electromagnetic field will be described.

In FIG. 8, the substrate 200 can be a panel substrate of a display device or a temporary donor substrate for transfer.

In the following description, the substrate 200 will be described as a panel substrate of a display device, but the embodiment is not limited thereto.

The substrate 200 can be formed of glass or polyimide. Also, the substrate 200 can include a flexible material such as polyethylene naphthalate (PEN) or polyethylene terephthalate (PET). Also, the substrate 200 can be a transparent material, but is not limited thereto.

Referring to FIG. 8, the light emitting device 150R can be put into a chamber 1300 filled with a fluid 1200. The fluid 1200 can be water such as ultrapure water, but is not limited thereto. A chamber can also be called a water bath, container, vessel, or the like.

Thereafter, the substrate 200 can be disposed on the chamber 1300. Depending on the embodiment, the substrate 200 can be introduced into the chamber 1300.

A pair of first electrodes 211 and a second electrode 212 corresponding to each of the light emitting devices 150R to be assembled can be formed on the substrate 200.

The first electrode 211 and the second electrode 212 can be formed of a transparent electrode (ITO) or can include a metal material having excellent electrical conductivity. For example, the first electrode 211 and the second electrode 212 can include at least one of titanium (Ti), chromium (Cr), nickel (Ni), aluminum (Al), platinum (Pt), gold (Au), tungsten (W), or molybdenum (Mo) or an alloy thereof.

The first electrode 211 and the second electrode 212 can function as a pair of assembly electrodes for fixing the assembled light emitting device 150R to the assembly hole 203 on the substrate 200 by emitting an electric field as voltage is applied thereto.

The distance between the first electrode 211 and the second electrode 212 is smaller than the width of the light emitting device 150R and the width of the assembly hole 203, the assembly position of the light emitting device 150R using an electric field can be more accurately fixed.

An insulating layer 220 is formed on the first electrode 211 and the second electrode 212, the first electrode 211 and the second electrode 212 can be protected from the fluid 1200 and current flowing through the first electrode 211 and the second electrode 212 can be prevented from leaking. The insulating layer 220 can be formed of a single layer or multiple layers of an inorganic insulator such as silica or alumina or an organic insulator.

Also, the insulating layer 220 can include an insulating and flexible material such as polyimide, PEN, or PET, and can be formed integrally with the substrate 200 to form a single substrate.

The insulating layer 220 can be an adhesive insulating layer or a conductive adhesive layer having conductivity. Since the insulating layer 220 is flexible, it can enable a flexible function of the display device.

A barrier wall 200S can be formed on an upper portion of the insulating layer 220. A partial region of the barrier wall 200S can be located above the first electrode 211 and the second electrode 212.

For example, when the substrate 200 is formed, some of the barrier walls formed on the insulating layer 220 can be removed to form assembly holes 203 in which each of the light emitting devices 150R is assembled to the substrate 200. A second pad electrode 222 can be formed between the barrier wall 200S and the insulating layer 220 to apply power to the light emitting device 150R.

An assembly hole 203 to which the light emitting devices 150R are coupled is formed in the substrate 200, and a surface on which the assembly hole 203 is formed can contact the fluid 1200. The assembly hole 203 can guide an accurate assembly position of the light emitting device 150R.

Meanwhile, the assembly hole 203 can have a shape and size corresponding to the shape of the light emitting device 150R to be assembled at the corresponding position. Accordingly, it is possible to prevent assembling another light emitting device or assembling a plurality of light emitting devices into the assembly hole 203.

Referring back to FIG. 8, after the substrate 200 is disposed, the assembly device 1100 including the magnetic material can move along the substrate 200. As the magnetic material, for example, a magnet or an electromagnet can be used. The assembly device 1100 can move while in contact with the substrate 200 in order to maximize the area of the magnetic field into the fluid 1200. Depending on the embodiment, the assembly device 1100 can include a plurality of magnetic bodies or can include a magnetic body having a size corresponding to that of the substrate 200. In this case, the moving distance of the assembling device 1100 can be limited within a predetermined range.

The light emitting device 150R in the chamber 1300 can move toward the assembly device 1100 by the magnetic field generated by the assembly device 1100.

While moving toward the assembly device 1100, the light emitting device 150R can enter the assembly hole 203 and come into contact with the substrate 200.

At this time, by the electric field applied by the first electrode 211 and the second electrode 212 formed on the substrate 200, the light emitting device 150R in contact with the substrate 200 can be prevented from being separated by the movement of the assembly device 1100.

That is, since the time required for assembling each of the light emitting devices 150R to the substrate 200 can be drastically reduced by the above-described self-assembly method using the electromagnetic field, a large-area high-pixel display can be implement more quickly and economically.

A predetermined solder layer 225 is further formed between the light emitting device 150R assembled on the assembly hole 203 of the substrate 200 and the second pad electrode 222 to improve bonding strength of the light emitting device 150R.

Thereafter, the first pad electrode 221 is connected to the light emitting device 150R, and power can be applied.

Next, a molding layer 230 can be formed on the barrier wall 200S of the substrate 200 and the assembly hole 203. The molding layer 230 can be a transparent resin or a resin containing a reflective material or a scattering material.

Meanwhile, in the display device according to the embodiment, a light emitting device is used as a light source. The light emitting device of the embodiment is a self-emitting device that emits light by itself when electricity is applied, and can be a semiconductor light emitting device. Since the light emitting device of the embodiment is made of an inorganic semiconductor material, it is resistant to deterioration and has a semi-permanent lifespan, so it can contribute to realizing high-quality and high-definition images in a display device by providing stable light.

FIG. 9 is a schematic cross-sectional view of the display panel of FIG. 2.

Referring to FIG. 9, the display panel 10 of the embodiment can include a first substrate 40, a light emitting unit 41, a color generating unit 42, and a second substrate 46. The display panel 10 of the embodiment can include more components than these, but is not limited thereto. The first substrate 40 can be the substrate 200 shown in FIG. 7.

Although not shown, at least one insulating layer can be disposed between the first substrate 40 and the light emitting unit 41, between the light emitting part 41 and the color generating part 42 and/or between the color generating part 42 and the second substrate 46, but is not limited thereto.

The first substrate 40 can support the light emitting unit 41, the color generating unit 42, and the second substrate 46. Various elements as described above can be formed on the second substrate 46, for example, data lines D1 to Dm (m is an integer of 2 or greater), scan lines (S1 to Sn), a high potential voltage line (VDDL) and a low potential voltage line (VSSL) as shown in FIG. 2, as shown in FIG. 3, a plurality of transistors and at least one capacitor, and as shown in FIG. 4, the first pad electrode 210 and the second pad electrode 220.

The first substrate 40 can be formed of glass, but is not limited thereto.

The light emitting unit 41 can provide light to the color generating unit 42. The light emitting unit 41 can include a plurality of light sources that emit light themselves by applying electricity. For example, the light source can include a light emitting device (300 in FIG. 5, 150 in FIGS. 6, 10).

For example, the plurality of light emitting devices 150 can be separately disposed for each sub-pixel of a pixel and independently emit light by controlling each sub-pixel.

As another example, the plurality of light emitting devices 150 can be arranged regardless of pixel division and simultaneously emit light from all sub-pixels.

The light emitting device 150 of the embodiment can emit blue light, but is not limited thereto. For example, the light emitting device 150 of the embodiment can emit white light or purple light.

Meanwhile, the light emitting device 150 can emit red light, green light, and blue light for each sub-pixel. To this end, for example, a red light emitting device emitting red light can be disposed in the first sub-pixel, that is, the red sub-pixel. A green light emitting device emitting green light can be disposed in the second sub-pixel, that is, the green sub-pixel. A blue light emitting device emitting blue light can be disposed in the third sub-pixel, that is, the blue sub-pixel.

For example, each of a red light emitting device, a green light emitting device, and a blue light emitting device can include a group II-IV compound or a group III-V compound, but is not limited thereto. The III-V compound can be selected from the group including of a binary compound selected from the group including of GaN, GaP, GaAs, GaSb, AlN, AlP, AlAs, AlSb, InN, InP, InAs, InSb and mixtures thereof, a three-element compound selected from the group including of GaNP, GaNAs, GaNSb, GaPAs, GaPSb, AlInP, AlNP, AlNAs, AlNSb, AlPAs, AlPSb, InNP, InNAs, InNSb, InPAs, InPSb, GaAlNP and mixtures thereof and quaternary compounds selected from the group including of AlGaInP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and mixtures thereof.

The color generating unit 42 can generate light of a different color from the light provided by the light emitting unit 41.

For example, the color generator 42 can include a first color generator 43, a second color generator 44, and a third color generator 45. The first color generator 43 can correspond to the first sub-pixel PX1 of the pixel, the second color generator 44 can correspond to the second sub-pixel PX2 of the pixel, and the third color generator 45 can correspond to the third sub-pixel PX3 of the pixel.

The first color generating unit 43 can generate first color light based on the light provided from the light emitting unit 41, the second color generating unit 44 can generate second color light based on the light provided from the light emitting unit 41, and the third color generating unit 45 can generate third color light based on the light provided from the light emitting unit 41. For example, the first color generating unit 43 outputs blue light from the light emitting unit 41 as red light, the second color generator 44 outputs blue light from the light emitting unit 41 as green light, and the third color generator 45 outputs blue light from the light emitting unit 41 as it is.

For example, the first color generator 43 includes a first color filter, and the second color generator 44 can include a second color filter, and the third color generator 45 can include a third color filter.

The first color filter, the second color filter, and the third color filter can be formed of a transparent material through which light can pass.

For example, at least one of the first color filter, the second color filter, and the third color filter can include a quantum dot.

The quantum dot of the embodiment can be selected from a group II-IV compound, a group IV-VI compound, a group IV element, a group IV compound, and a combination thereof.

The II-VI compound can be selected from the group including of a binary compound selected from the group including of CdSe, CdTe, ZnS, ZnSe, ZnTe, ZnO, HgS, HgSe, HgTe, MgSe, MgS and mixtures thereof, a three-element compound selected from the group including of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and mixtures thereof and quaternary compounds selected from the group including of HgZnTeS, CdZnSeS, CdZnSeTe, CdZnSTe, CdHgSeS, CdHgSeTe, CdHgSTe, HgZnSeS, HgZnSeTe, HgZnSTe and mixtures thereof.

The III-V compound can be selected from the group including of a binary compound selected from the group including of GaN, GaP, GaAs, GaSb, AlN, AlP, AlAs, AlSb, InN, InP, InAs, InSb and mixtures thereof, a three-element compound selected from the group including of GaNP, GaNAs, GaNSb, GaPAs, GaPSb, AlInP, AlNP, AlNAs, AlNSb, AlPAs, AlPSb, InNP, InNAs, InNSb, InPAs, InPSb, GaAlNP and mixtures thereof and quaternary compounds selected from the group including of AlGaInP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and mixtures thereof.

The IV-VI compound can be selected from the group including of a binary compound selected from the group including of SnS, SnSe, SnTe, PbS, PbSe, PbTe and mixtures thereof, a three-element compound selected from the group including of SnSeS, SnSeTe, SnSTe, PbSeS, PbSeTe, PbSTe, SnPbS, SnPbSe, SnPbTe and mixtures thereof and quaternary compounds selected from the group including of SnPbSSe, SnPbSeTe, SnPbSTe and mixtures thereof.

Group IV elements can be selected from the group including of Si, Ge, and mixtures thereof. The group IV compound can be a binary element compound selected from the group including of SiC, SiGe, and mixtures thereof.

These quantum dots can have a full width of half maximum (FWHM) of an emission wavelength spectrum of about 45 nm or less, and light emitted through the quantum dots can be emitted in all directions. Accordingly, the viewing angle of the light emitting display device can be improved.

On the other hand, quantum dots can have the form of spherical, pyramidal, multi-arm, or cubic nanoparticles, nanotubes, nanowires, nanofibers, nanoplatelet particles, etc. but, is not limited to this.

For example, when the light emitting device 150 emits blue light, the first color filter can include red quantum dots, and the second color filter can include green quantum dots. The third color filter may not include quantum dots, but is not limited thereto. For example, blue light from the light emitting device 150 is absorbed by the first color filter, and the absorbed blue light is wavelength-shifted by red quantum dots to output red light. For example, blue light from the light emitting device 150 is absorbed by the second color filter, and the wavelength of the absorbed blue light is shifted by green quantum dots to output green light. For example, blue light from a foot and an element can be absorbed by the third color filter, and the absorbed blue light can be emitted as it is.

Meanwhile, when the light emitting device 150 emits white light, not only the first color filter and the second color filter, but also the third color filter can include quantum dots. That is, the wavelength of white light of the light emitting device 150 can be shifted to blue light by the quantum dots included in the third color filter.

For example, at least one of the first color filter, the second color filter, and the third color filter can include a phosphor. For example, some of the first color filters, the second color filters, and the third color filters can include quantum dots, and others can include phosphors. For example, each of the first color filter and the second color filter can include a phosphor and a quantum dot. For example, at least one of the first color filter, the second color filter, and the third color filter can include scattering particles. Since blue light incident on each of the first color filter, the second color filter, and the third color filter is scattered by the scattering particles and the color of the scattered blue light is shifted by the corresponding quantum dots, light output efficiency can be improved.

As another example, the first color generator 43 can include a first color conversion layer and a first color filter. The second color generator 44 can include a second color converter and a second color filter. The third color generator 45 can include a third color conversion layer and a third color filter. Each of the first color conversion layer, the second color conversion layer, and the third color conversion layer can be disposed adjacent to the light emitting unit 41. The first color filter, the second color filter and the third color filter can be disposed adjacent to the second substrate 46.

For example, the first color filter can be disposed between the first color conversion layer and the second substrate 46. For example, the second color filter can be disposed between the second color conversion layer and the second substrate 46. For example, the third color filter can be disposed between the third color conversion layer and the second substrate 46.

For example, the first color filter can contact the upper surface of the first color conversion layer and have the same size as the first color conversion layer, but is not limited thereto. For example, the second color filter can contact the upper surface of the second color conversion layer and have the same size as the second color conversion layer, but is not limited thereto. For example, the third color filter can contact the upper surface of the third color conversion layer and have the same size as the third color conversion layer, but is not limited thereto.

For example, the first color conversion layer can include red quantum dots, and the second color conversion layer can include green quantum dots. The third color conversion layer may not include quantum dots. For example, the first color filter can include a red-based material that selectively transmits the red light converted in the first color conversion layer, the second color filter can include a green-based material that selectively transmits the green light converted in the second color conversion layer, and the third color filter can include a blue-based material that selectively transmits blue light transmitted through the third color conversion layer as it is.

Meanwhile, when the light emitting device 150 emits white light, not only the first color conversion layer and the second color conversion layer, but also the third color conversion layer can include quantum dots. That is, the wavelength of white light of the light emitting device 150 can be shifted to blue light by the quantum dots included in the third color filter.

Referring back to FIG. 9, the second substrate 46 can be disposed on the color generator 42 to protect the color generator 42. The second substrate 46 can be formed of glass, but is not limited thereto.

The second substrate 46 can be called a cover window, a cover glass, or the like.

The second substrate 46 can be formed of glass, but is not limited thereto.

Meanwhile, the embodiment provides a display device capable of minimizing an assembly defect rate by controlling the assembly direction of light emitting devices. Accordingly, the light emitting efficiency and luminance of the display device can be improved.

The embodiment provides a display device capable of improving light emitting efficiency and luminance by changing the shape of a light emitting device.

In the embodiment, assembly directionality means that light emitting devices are assembled in a predetermined directionality. When the light emitting devices are assembled according to a predetermined direction, the corresponding light emitting devices can emit light. Assembling according to a predetermined direction means that the light emitting devices are correctly assembled to enable light emission. For example, when assembled such that one side of the light emitting device is positioned on the first wiring line on the substrate and the other side of the light emitting device is positioned on the second wiring line on the substrate, the light emitting device can emit light.

In the embodiment, the control of the assembly direction refers to controlling the assembly direction to be as described above.

Hereinafter, various embodiments for achieving this problem will be described.

Figure 10:
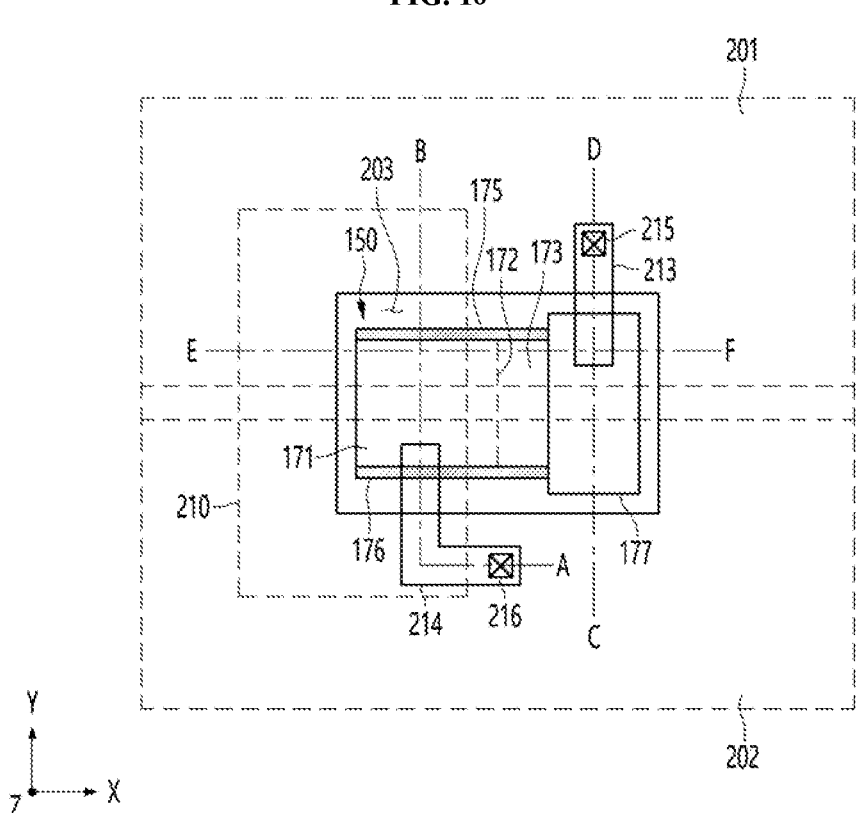
FIG. 10 is a plan view illustrating a display device according to an exemplary embodiment.
Figure 11:
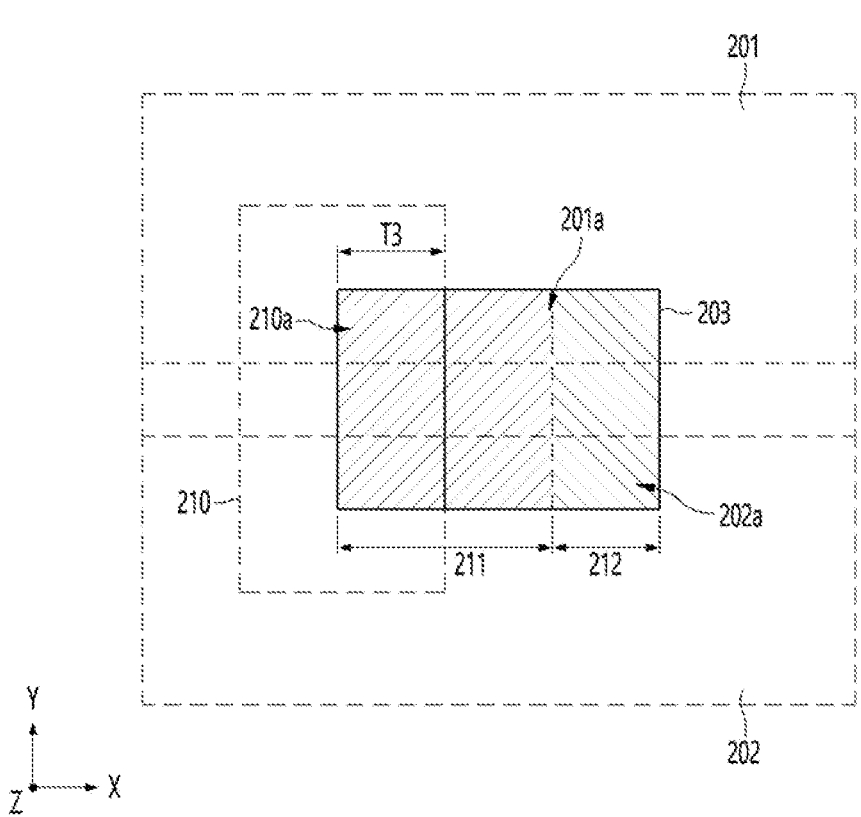
FIG. 11 is a plan view illustrating a case in which the light emitting device in FIG. 10 is not assembled.

FIG. 10 is a plan view illustrating a display device according to an embodiment. FIG. 11 is a plan view illustrating a case in which the light emitting device in FIG. 10 is not assembled.

Figure 12:
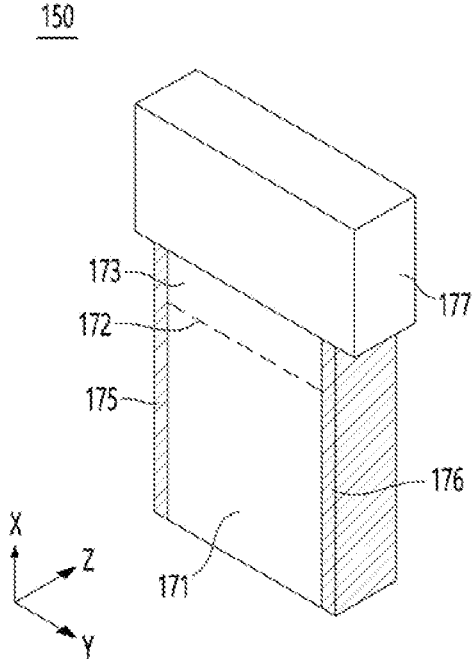
FIG. 12 is a perspective view showing a light emitting device according to an embodiment.
Figure 13:
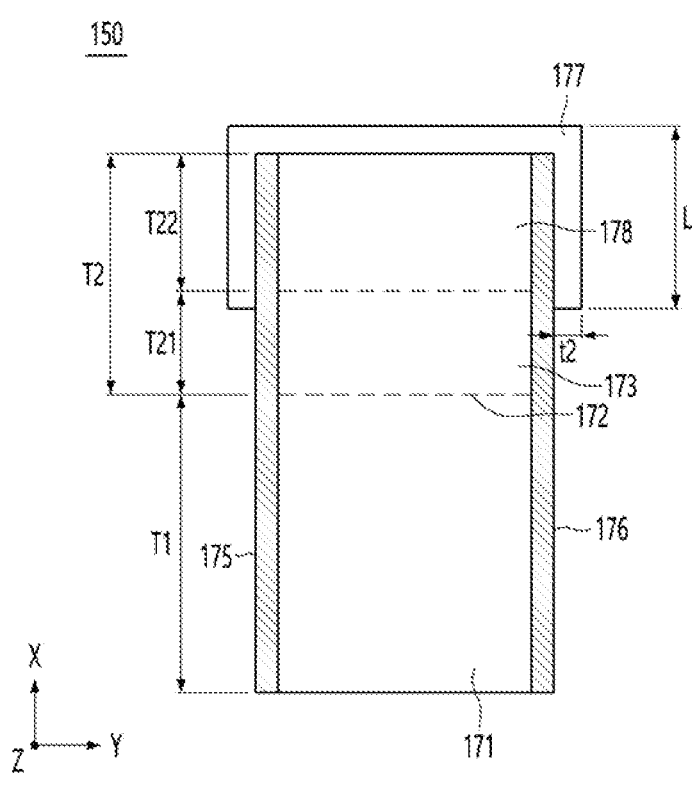
FIG. 13 is a cross-sectional view showing a light emitting device of an embodiment.

FIG. 12 is a perspective view showing a light emitting device according to an embodiment. FIG. 13 is a cross-sectional view showing a light emitting device of an embodiment.

Figure 14:
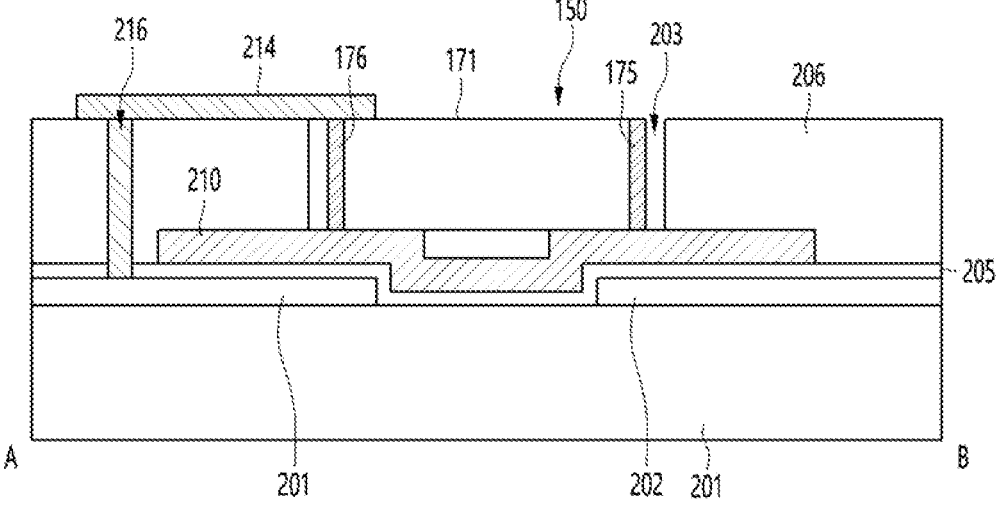
FIG. 14 is a cross-sectional view of the display device shown in FIG. 10 taken along line A-B.
Figure 15:
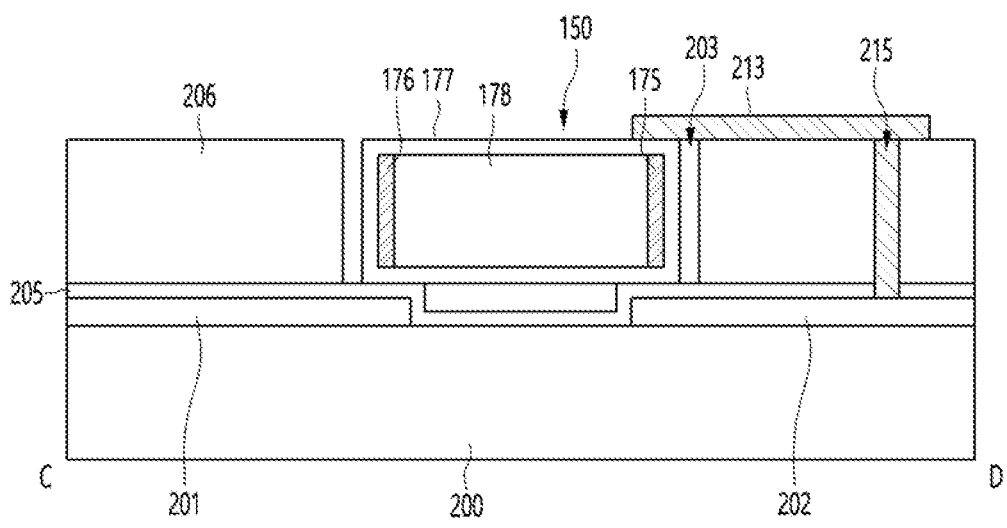
FIG. 15 is a cross-sectional view of the display device shown in FIG. 10 taken along line C-D.
Figure 16:
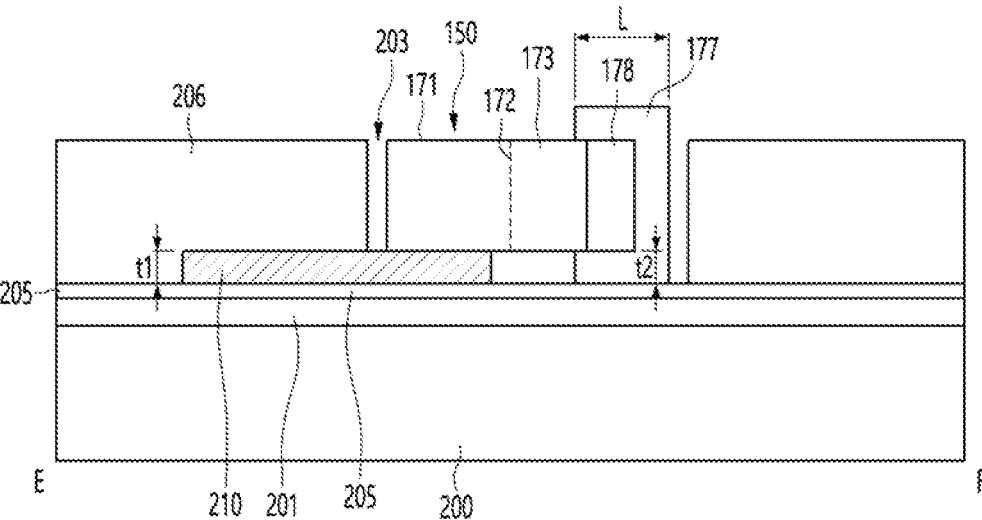
FIG. 16 is a cross-sectional view of the display device shown in FIG. 10 along line E-F.

FIG. 14 is a cross-sectional view of the display device shown in FIG. 10 taken along line A-B. FIG. 15 is a cross-sectional view taken along line C-D of the display device shown in FIG. 10. FIG. 16 is a cross-sectional view of the display device shown in FIG. 10 taken along line E-F.

Referring to FIGS. 10 and 14 to 16, the display device according to the embodiment can include a substrate 200, a plurality of first wiring lines 201, a plurality of second wiring lines 202, a first insulating member 205, a plurality of blocking members 210, a second insulating member 206 and a plurality of light emitting devices 150.

Although FIG. 10 shows the light emitting device 150 shown in one assembly hole 203, in the display device according to the embodiment, the light emitting device 150 can be disposed in each of a plurality of assembly holes 203.

That is, as shown in FIG. 2, the display device of the embodiment includes a plurality of pixels PX, each pixel PX can include, for example, a first sub-pixel PX1, a second sub-pixel PX2, and a third sub-pixel PX3. A plurality of light emitting devices 300 can be included in each of the first sub-pixel PX1, the second sub-pixel PX2, and the third sub-pixel PX3. These light emitting devices 300 are disposed between the first pad electrode 210 and the second pad electrode 220, and can emit light by a voltage applied to the first pad electrode 210 and the second pad electrode 220.

For example, each of the first pad electrode 210 and the second pad electrode 220 can be the first wiring line 201 and the second wiring line 202 shown in FIG. 10. In this case, the first wiring line 201 and the second wiring line 202 generate dielectrophoretic force to assemble the light emitting device 150, and can be members that apply a voltage to the light emitting device 150 to cause the corresponding light emitting device 150 to emit light.

For example, each of the first pad electrode 210 and the second pad electrode 220 can be a separate electrode line other than the first wiring line 201 and the second wiring line 202 shown in FIG. 10. That is, in FIG. 10, the first wiring line 201 and the second wiring line 202 can be members for applying a voltage for generating dielectrophoretic force to assemble the light emitting device 150. Separately, a first electrode line and a second electrode line are provided, and each of the first electrode line and the second electrode line is electrically connected to both sides of the light emitting device 150, so that the corresponding light emitting device 150 can emit light by the voltage applied from the first electrode line and the second electrode line.

Referring back to FIG. 5, the light emitting device 300 can include a plurality of red light emitting devices, a plurality of green light emitting devices disposed in the second sub-pixel PX2 and a plurality of blue light emitting devices disposed in the third sub-pixel PX3 disposed in the first sub-pixel PX1.

FIG. 10 shows an assembly hole 203 for assembling one light emitting device 150 included in any sub-pixel among the first to third sub-pixels (PX1, PX2, PX3) shown in FIG. 5.

Referring to FIG. 10, the substrate 200 can be a base substrate for forming these components, that is, the first wiring line 201 and the second wiring line 202, the first insulating member 205, the blocking member 210 and the second insulating member 206.

For example, the substrate 200 can have rigid characteristics. For example, the substrate 200 can have a flexible property. For example, the substrate 200 can have a stretchable property. For example, the substrate 200 can have a rollable property. Also, the substrate 200 can have various characteristics such as strength and warpage.

For example, the substrate 200 can be glass. For example, the substrate 200 can be a resin material. For example, the substrate 200 can be a plastic material. Also, the substrate 200 can be formed of various materials.

In the display device according to the embodiment, the substrate 200 can be a single substrate. In the display device according to the embodiment, the substrate 200 can include a plurality of substrates connected to each other. In the display device according to the embodiment, the substrate 200 can include at least one or more layers.

The first wiring line 201 and the second wiring line 202 can be disposed on the substrate 200. The first wiring line 201 and the second wiring line 202 can be spaced apart from each other, face each other, and can be parallel to each other, but are not limited thereto.

The first wiring line 201 and the second wiring line 202 can be made of a metal material. The first wiring line 201 and the second wiring line 202 can generate dielectrophoretic force in a direction perpendicular to the longitudinal direction of the first wiring line 201 and the second wiring line 202 by a voltage. When the light emitting device 150 having a specific condition is placed between the first wiring line 201 and the second wiring line 202, the dielectrophoretic force can causes the light emitting device 150 to be assembled into the first wiring line 201 and the second wiring line 202 or away from the first wiring line 201 and the second wiring line 202, respectively. Here, the specific condition can be the first metal layer 177 and the insulating layers 175 and 176 of the light emitting device 150. For example, when the first metal layer 177 of the light emitting device 150 is placed between the first wiring line 201 and the second wiring line 202, the light emitting device 150 can be assembled with the first wiring line 201 and the second wiring line 202. When the insulating layers 175 and 176 of the light emitting device 150 are placed between the first wiring line 201 and the second wiring line 202, the light emitting device 150 can be farther away from each of the first wiring line 201 and the second wiring line 202.

The first insulating member 205 can be disposed on the entire area of the substrate 200. For example, the first insulating member 205 can be disposed on the first wiring line 201 and the second wiring line 202. The first insulating member 205 can protect the first wiring line 201 and the second wiring line 202 and prevent a short circuit between the first wiring line 201 and the second endorsement line. The first insulating member 205 can be made of an inorganic material such as SiOx, but is not limited thereto.

The blocking member 210 can be disposed across the first wiring line 201 and the second wiring line 202. That is, the blocking member 210 can pass between the first wiring line 201 and the second wiring line 202 on the first wiring line 201 and can be disposed on the second wiring line 202.

The blocking member 210 can be made of a metal material. As the metal material, Ti, Al, or the like can be used.

The blocking member 210 can be a member for blocking dielectrophoretic force formed between the first wiring line 201 and the second wiring line 202. That is, the blocking member 210 is disposed on the first wiring line 201 and the second wiring line 202 and between the first wiring line 201 and the second wiring line 202, dielectrophoretic force is not generated between the first wiring line 201 and the second wiring line 202 due to the blocking member 210.

The blocking member 210 can be a member for controlling the assembly direction of the light emitting device 150. This will be explained in detail later.

The second insulating member 206 can be disposed over the entire area of the substrate 200. For example, the second insulating member 206 can be disposed on the blocking member 210. For example, the second insulating member 206 can be disposed on the first wiring line 201 and the second wiring line 202. For example, the second insulating member 206 can be disposed on the first insulating member 205.

The second insulating member 206 can be made of an organic material, but is not limited thereto.

The second insulating member 206 can be a planarization layer. That is, the second insulating member 206 can be relatively thick and have a flat top surface. Accordingly, the step formed by the first wiring line 201, the second wiring line 202, and the blocking member 210 is removed, then, during the post process, the member can be easily and accurately formed on the second insulating member 206 by the post process.

Meanwhile, the second insulating member 206 can include a plurality of assembly holes 203. A light emitting device 150 can be assembled into each of the plurality of assembly holes 203. For example, the second insulating member 206 is formed on the entire area of the substrate 200, and the second insulating member 206 is locally removed so that the size is equal to or larger than the size of the light emitting device 150, a plurality of assembly holes 203 can be formed.

As the second insulating member is locally removed, a portion 201a of the first wiring line 201, a portion 202a of the second wiring line 202, and a portion 210a of the blocking member 210 can be positioned within the assembly hole 203. Particularly, a portion 210a of the blocking member 210 in the assembly hole 203 can be exposed to the outside.

Each of the plurality of assembly holes 203 can include a first region 211 closer to the blocking member 210 and a second region 212 farther than the first region 211 from the blocking member 210.

For example, a portion 210a of the blocking member 210 can be disposed in the first area 211 of the assembly hole 203. In the assembly hole 203, a portion 210a of the blocking member 210 can be disposed to cross a portion 201a of the first wiring line 201 and a portion 202a of the second wiring line 202.

By a voltage applied between a part 201a of the first wiring line 201 and a part 202a of the second wiring line 202 in the assembly hole 203, a dielectrophoretic force can be generated in the first region 211 and the second region 212 of the assembly hole 203. In this case, since the dielectrophoretic force formed by the voltage applied between the part 201_a_ of the first wiring line 201 and the part 202_a_ of the second wiring line 202 is blocked by the portion 210_a_ of the blocking member 210 within the assembly hole 203, the dielectrophoretic force is not formed in the first region 211 within the assembly hole 203. Therefore, the dielectrophoretic force may not be formed in the first region 211 of the assembly hole 203 and the dielectrophoretic force can be formed only in the second region 212.

As shown in FIG. 12, the light emitting device 150 can be a plate type light emitting device 150. Also, although not shown in the drawings, the light emitting device 150 of the embodiment can include a cylindrical light emitting device, a disk light emitting device, a micro light emitting device, a nano light emitting device, a rod light emitting device, and the like.

The plate-type light emitting device 150 includes four side surfaces, a lower surface and an upper surface, and can have a quadrangular cross-sectional area. Two side surfaces facing each other, which are sides perpendicular to the Y-axis direction, are referred to as short side surfaces, and two side surfaces facing each other, which are sides perpendicular to the Z-axis direction, are referred to as long side surfaces.

The plate-type light emitting device 150 can have a major axis along the Y-axis direction and a minor axis along the Z-axis direction. For example, the length of the major axis can be at least 50 times greater than the length of the minor axis. In this way, by maximizing the length of the major axis compared to the length of the minor axis, it is possible to dramatically improve the luminous efficiency and luminance by maximizing the light emitting area. Also, the area of the long side surface can be maximized by reducing the width of the short side surface as much as possible and increasing the width of the long side surface as much as possible. As such, assembly performance due to the maximized long side surface can be improved. That is, the wider the long side surface of the light emitting device 150, the surface contact with the corresponding side surface of the light emitting device 150 in the assembly hole 203, the light emitting device 150 can be assembled more stably in the assembly hole 203.

Hereinafter, the light emitting device 150 of the embodiment will be described with reference to FIGS. 12 and 13.

The light emitting device 150 of the embodiment can be a light emitting device disposed in one of the first sub-pixel PX1, the second sub-pixel PX2, and the third sub-pixel PX3 shown in FIG. 5.

Referring to FIGS. 12 and 13, the light emitting device 150 of the embodiment can include a first conductivity-type semiconductor layer 171, the active layer 172, the second conductivity-type semiconductor layer 173, the first and second insulating layers 175 and 176, the first metal layer 177 and the second metal layer 178. The active layer 172 can be called a light emitting layer or a light emitting region. The first and second insulating layers 175 and 176 can be referred to as first and second passivation layers and first and second protective layers, respectively. After the first conductivity-type semiconductor layer 171, the active layer 172, the second conductivity-type semiconductor layer 173, the first and second insulating layers 175 and 176 and the first metal layer 177 are formed on the substrate for growth, the substrate for growth can be removed using a separate process, for example, a laser lift-off (LLO) process. The substrate for growth can be a sapphire substrate or a semiconductor substrate, but is not limited thereto.

The first conductivity-type semiconductor layer 171 can be formed on the substrate for growth. Before the first conductivity-type semiconductor layer 171 is formed, a buffer layer (not shown) can be formed to alleviate lattice mismatch between the growth substrate and the first conductivity-type semiconductor layer 171.

The first conductivity-type semiconductor layer 171 can be provided as a compound semiconductor. The first conductivity-type semiconductor layer 171 can be provided as, for example, a Group II-VI compound semiconductor or a Group III-V compound semiconductor. For example, the first conductivity-type semiconductor layer 171 can be doped with an n-type dopant such as Si, Ge, Sn, Se, or Te.

The active layer 172 can be formed on the first conductivity-type semiconductor layer 171.

The active layer 172 can generate light of a wavelength band corresponding to a combination of the first carrier (eg, electrons) provided from the first conductivity-type semiconductor layer 171 and the second carrier provided from the second conductivity-type semiconductor layer 173 The active layer 172 can have any one or more of a single well structure, a multi-well structure, a quantum dot structure, or a quantum wire structure. The active layer 172 can be provided as a compound semiconductor. The active layer 172 can be provided with, for example, a Group II-VI or Group III-V compound semiconductor. When the active layer 172 is provided in a multi-well structure, the active layer 172 can be provided by stacking a plurality of barrier layers and a plurality of well layers.

The second conductivity-type semiconductor layer 173 can be formed on the active layer 172. The second conductivity-type semiconductor layer 173 can be provided as a compound semiconductor. The second conductivity-type semiconductor layer 173 can be provided as, for example, a Group II-VI compound semiconductor or a Group III-V compound semiconductor. For example, the second conductivity-type semiconductor layer 173 can be doped with a p-type dopant such as Mg, Zn, Ca, Sr, or Ba.

The first conductivity-type semiconductor layer 171, the active layer 172, and the second conductivity-type semiconductor layer 173 can be grown using deposition equipment, for example, MOCVD equipment.

The second metal layer 178 can be formed on the second conductivity-type semiconductor layer 173. The second metal layer 178 can be made of a magnetic material. As the magnetic material, for example, Ni or the like can be used, but is not limited thereto. In the light emitting device 150 of the embodiment, by forming one layer 181 of the first electrode 180 with a magnetic material, as shown in FIG. 8, when the self-assembly process is performed, when the assembly device 1100 including the magnetic material moves along the substrate 200, the magnetic material included in the second metal layer 178 of the light emitting device 150 of the embodiment accommodated in the chamber 1300 is magnetized, and the light emitting device 150 of the embodiment can be inserted into the assembly hole 203 of the substrate 200. Accordingly, the light emitting device 150 of the embodiment can be quickly and accurately inserted into the assembly hole 203 of the substrate 200 according to the movement of the assembly device 1100, so that the self-assembly speed can be dramatically improved.

When the thickness of the second conductivity-type semiconductor layer 173 is T21 and the thickness of the second metal layer 178 is T22, the thickness T2 of the second conductivity-type semiconductor layer 173 and the second metal layer 178 can be the same as or similar to the thickness T1 of the first conductivity-type semiconductor layer 171. With this structure, the active layer 172 can be located at the center of the light emitting device 150 of the embodiment.

Since the active layer 172 is located at the center of the light emitting device 150 of the embodiment, the intensity of light emitted from the light emitting device 150 of the embodiment can have a symmetrical distribution with respect to the active layer 172. Accordingly, a uniform beam angle of light can be obtained and uniform luminance can be secured in each of the sub-pixels PX1, PX2, and PX3.

The second metal layer 178, the second conductivity-type semiconductor layer 173, the active layer 172, and the first conductivity-type semiconductor layer 171 can be etched using the mesa process. Through this mesa process, the plate-shaped first conductive semiconductor layer 171, the active layer 172, the second conductive semiconductor layer 173, and the second metal layer 178 can be formed.

Each of the first insulating layer 175 and the second insulating layer 176 can be formed on both end surfaces of the light emitting device 150. For example, the first insulating layer 175 can be formed on the first short side surface of the light emitting device 150 and the second insulating layer 176 can be formed on the second short side surface of the light emitting device 150. The first insulating layer 175 and the second insulating layer 176 can be made of an inorganic material such as SiNx.

The first and second insulating layers 175 and 176 can block leakage current flowing along the side surface of the light emitting device 150. The first and second insulating layers 175 and 176 protect the side surfaces of the light emitting device 150, a short circuit can be prevented from occurring between the first conductivity-type semiconductor layer 171 and the second conductivity-type semiconductor layer 173.

In particular, the first and second insulating layers 175 and 176 can be members for controlling the assembly direction of the light emitting device 150. This will be explained in detail later.

Although it is shown in the drawing that the first and second insulating layers 175 and 176 are formed only on the short side surface of the light emitting device 150, insulating layers 175 and 176 can be formed on the long side as well as the short side of the light emitting device 150. That is, the insulating layers 175 and 176 can be formed along the perimeter of the light emitting device 150, for example, the first conductive semiconductor layer 171, the active layer 172, the second conductivity-type semiconductor layer 173 and the second metal layer 178 respectively.

For example, the insulating layers 175 and 176 may not be formed on the side surfaces of the second metal layer 178. For example, the insulating layers 175 and 176 may not be formed on the side surfaces of the second conductivity-type semiconductor layer 173. For example, the insulating layers 175 and 176 may not be formed on the side surfaces of the active layer 172.

The first metal layer 177 can be formed along a portion of the circumference of the light emitting device 150. That is, the first metal layer 177 can surround a portion of the light emitting device 150.

For example, the first metal layer 177 can surround the second conductive semiconductor layer 173. For example, the first metal layer 177 can surround the second metal layer 178.

The first metal layer 177 can be disposed on the first and second insulating layers 175 and 176. When the first and second insulating layers 175 and 176 are not formed on each side of the second conductive semiconductor layer 173 and the second metal layer 178, the first metal layer 177 can be formed on side surfaces of the second conductive semiconductor layer 173 and the second metal layer 178, instead of being formed on the first and second insulating layers 175 and 176.

The first metal layer 177 can be made of a metal material. For example, the first metal layer 177 can be made of a metal material that does not stick to the blocking member 210.

The first metal layer 177 can be a member for controlling the assembly direction of the light emitting device 150. This will be explained in detail later.

Hereinafter, referring to FIGS. 17 to 19, depending on the arrangement position of the light emitting device 150, it will be described in detail that it is not assembled or assembled to the assembly hole 203.

As shown in FIG. 17, a first wiring line 201 and a second wiring line 202 can be disposed in the assembly hole 203 along the X-axis direction. The first wiring line 201 and the second wiring line 202 can be spaced apart from each other by a predetermined interval. A blocking member 210 can be disposed in the assembly hole 203 along the Y-axis direction. That is, the blocking member 210 can be disposed in a direction perpendicular to the longitudinal directions of the first wiring line 201 and the second wiring line 202. Within the assembly hole 203, the blocking member 210 can vertically overlap each of the first wiring line 201 and the second wiring line 202.

As shown in FIG. 11, the assembly hole 203 can include a first region 211 and a second region 212. The blocking member 210 can be disposed in the first region 211 of the assembly hole 203.

A voltage can be applied to the first wiring line 201 and the second wiring line 202 to generate electrophoretic force. In this case, as shown in FIG. 17, the electrophoretic force can be blocked by the blocking member 210 in the first region 211 of the assembly hole 203. Therefore, no electrophoretic force is formed in the first region 211 of the assembly hole 203. Since the blocking member 210 is not disposed in the second region 212 of the assembly hole 203, as shown in FIG. 17, electrophoretic force F can be formed in the second region 212 of the assembly hole 203.

The first region 211 of the assembly hole 203 can be a region in which self-assembly by the electrophoretic force F is not operated. And the second region 212 of the assembly hole 203 can be a region where self-assembly by the electrophoretic force F is operated.

Since the blocking member 210 is disposed in the first region 211 of the assembly hole 203, when the metal member is positioned on the first region 211 of the assembly hole 203, the metal member can be bounced away from the blocking member by the blocking member 210.

Since the dielectrophoretic force F is formed in the second region 212 of the assembly hole 203, when a metal member is positioned on the second area 212 of the assembly hole 203, the metal member can be pulled toward the first and second wiring lines 202. Also, when an insulating member is positioned on the second area 212 of the assembly hole 203, the insulating member can bounce away from the first and second wiring lines 202.

FIG. 18 shows a state in which the light emitting device 150 is not assembled in the assembly hole of FIG. 17.

As shown in FIG. 18, in the light emitting device 150 of the embodiment, the first metal layer 177 is located on the first region 211 of the assembly hole 203 and the first and second insulating layers 175 and 176 can be located on the second region 212 of the assembly hole 203.

In this case, in the first region 211 of the assembly hole 203, the first metal layer 177 of the light emitting device 150 can be pushed away from the blocking member 210 by the blocking member 210. In the second region 212 of the assembly hole 203, the first and second insulating layers 175 and 176 can be pushed away from the first and second wiring lines 202 by dielectrophoretic force. Therefore, when the first metal layer 177 of the light emitting device 150 is located on the first region 211 of the assembly hole 203 and the first and second insulating layers 175 and 176 of the light emitting device 150 are located on the second region 212 of the assembly hole 203, the light emitting device 150 can be projected out of the assembly hole 203 without being assembled into the assembly hole 203.

The corresponding light emitting device 150 is not positioned in a predetermined direction in the assembly hole 203, and thus bounces out of the assembly hole 203. Even if the light emitting device 150 bounces out of the assembly hole 203, the corresponding light emitting device 150 can be moved along with the movement of the assembly device 1100 including the magnetic material shown in FIG. 8 and assembled in another assembly hole. That is, when the protruded light emitting device 150 is positioned in a predetermined direction in another assembly hole, it can be assembled in another assembly hole. If the light emitting device 150 that has been pushed out is not positioned in a predetermined direction in another assembly hole, it can also bounce out of another assembly hole. By repeating this process, the corresponding light emitting device 150 can be assembled in the pre-determined assembly holes by trying to assemble them in several assembly holes.

FIG. 19 shows a state in which a light emitting device is assembled in the assembly hole of FIG. 17.

As shown in FIG. 19, in the light emitting device 150 of the embodiment, the first and second insulating layers 175 and 176 can be positioned on the first region 211 of the assembly hole 203 and a first metal layer 177 can be positioned on the second region 212 of the assembly hole 203.

In this case, in the first area 211 of the assembly hole 203, the first and second insulating layers 175 and 176 of the light emitting device 150 is not affected by the blocking member 210 and no dielectrophoretic force is formed by the blocking member 210, the position of the light emitting device 150 in the first region 211 of the assembly hole 203 does not vary greatly. In the second region 212 of the assembly hole 203, the first metal layer 177 can be pulled to the first and second wiring lines 202 by dielectrophoretic force. Accordingly, the light emitting device 150 can be assembled into the assembly hole 203 by the first metal layer 177 of the light emitting device 150 positioned on the second region 212 of the assembly hole 203.

In the prior art, light emitting devices are randomly dropped on a substrate, and the assembling direction of these light emitting devices cannot be controlled and assembled, resulting in low light emitting efficiency and low luminance.

As in the embodiment illustrated in FIGS. 17 to 19, by using a blocking member 210 on a substrate 200, and a first metal layer 177 and first and second insulating layers 175, 176 of a light emitting device 150, the assembly direction-ality of the light emitting device 150 is controlled so that the light emitting device 150 is assembled in the assembly hole 203 in the predetermined direction, thereby increasing the number of light emitting devices 150 assembled in the assembly hole 203 in the predetermined direction and sig-nificantly improving the luminous efficiency and luminance.

Hereinafter, referring to FIGS. 14 to 16, after the light emitting device 150 is assembled in the assembly hole 203, an electrical connection to enable light emitting of the light emitting device 150 by a post process will be described.

Referring to FIGS. 14 to 16, the light emitting device 150 can be disposed in a predetermined direction within the assembly hole 203. The first conductivity-type semiconduc-tor layer 171 of the light emitting device 150 can be disposed on the first region 211 of the assembly hole 203. The second conductive semiconductor layer 173, the first metal layer 177, and the second metal layer 178 of the light emitting device 150 can be disposed on the second region 212 of the assembly hole 203. That is, the first conductivity-type semi-conductor layer 171 of the light emitting device 150 can vertically overlap the blocking member 210. The second conductive semiconductor layer 173, the first metal layer 177, and the second metal layer 178 of the light emitting device 150 may not vertically overlap the blocking member 210.

Although not shown, the blocking member 210 can ver-tically overlap a part of the second conductivity-type semi-conductor layer 173 of the light emitting device 150, and may not vertically overlap the first metal layer 177.

As shown in FIG. 10, the first insulating layer 175 of the light emitting device 150 can vertically overlap a portion 201$a$ of the first wiring line 201. The second insulating layer 176 of the light emitting device 150 can vertically overlap a portion 202$a$ of the second wiring line 202. For example, the first insulating layer 175 of the light emitting device 150 can be disposed to face an inner surface of one side of the assembly hole 203. The second insulating layer 176 of the light emitting device 150 can be disposed to face the inner surface of the other side of the assembly layer.

The first conductivity-type semiconductor layer 171 of the light emitting device 150 can be disposed on the first region 211 of the assembly hole 203. The second conductivity-type semiconductor layer 173 of the light emitting device 150 can be disposed on the second region 212 of the assembly hole 203.

A part of the first conductivity-type semiconductor layer 171 of the light emitting device 150 can vertically overlap the first wiring line 201. Another part of the first conduc-tivity-type semiconductor layer 171 of the light emitting device 150 can vertically overlap the second wiring line 202. Accordingly, the first conductivity-type semiconductor layer 171 of the light emitting device 150 can be disposed across the first wiring line 201 and the second wiring line 202. When the thickness of the first wiring line 201 and the thickness of the second wiring line 202 are the same, the first conductivity-type semiconductor layer of the light emitting device 150 disposed on the first wiring line 201 and the second wiring line 202 can be parallel to the upper surface of the substrate 200.

A portion of each of the second conductivity-type semi-conductor layer 173, the first metal layer 177, and the second metal layer 178 of the light emitting device 150 can verti-cally overlap the first wiring line 201. Other portions of each of the second conductivity-type semiconductor layer 173, the first metal layer 177, and the second metal layer 178 of the light emitting device 150 can vertically overlap the second wiring line 202. Therefore, each of the second conductivity-type semiconductor layer 173 of the light emit-ting device 150, the first metal layer 177 and the second metal layer 178 can be disposed across the first wiring line 201 and the second wiring line 202. When the thickness of the first wiring line 201 and the thickness of the second wiring line 202 are the same, upper surfaces of the second conductivity-type semiconductor layers 173, The first metal layer 177 and the second metal layer 178 of the light emitting device disposed on the first wiring line 201 and the second wiring line 202 can be parallel to the top surface of the substrate 200.

The second conductivity-type semiconductor layer 173 of the light emitting device 150 can be in surface contact with the blocking member 210.

As shown in FIG. 16, the thickness t2 of the first metal layer 177 of the light emitting device 150 can be equal to or greater than the thickness t1 of the blocking member 210.

Therefore, since the upper surface of each of the first conductivity-type semiconductor layer, the second conductivity-type semiconductor layer 173, the first metal layer 177, and the second metal layer 178 of the light emitting device is parallel to the top surface of the substrate 200 and the thickness t2 of the first metal layer 177 of the light emitting device 150 is equal to or greater than the thickness t1 of the blocking member 210, the entire top surface of the light emitting device can be disposed parallel to the top surface of the substrate 200. Therefore, since light emitted from the active layer 172 on the upper surface of the light emitting device 150 has a symmetrical intensity distribution based on a vertical line passing through the active layer 172, it is possible to secure uniform luminance in each of the sub-pixels PX1, PX2, and PX3 by obtaining a uniform beam angle of light.

When the first and second insulating layers 175 and 176 of the light emitting device 150 are not formed on each side of the second conductive semiconductor layer 173 and the second metal layer 178, the first and second insulating layers 175 and 176 of the light emitting device 150 can be disposed only in the first region 211 within the assembly hole 203.

The first and second insulating layers 175 and 176 of the light emitting device 150 can contact a portion of the blocking member 210 (210a in FIG. 11) in the assembly hole 203.

When the first and second insulating layers 175 and 176 are not formed on the side surfaces of the second conductive semiconductor layer 173 and the second metal layer 178, the first metal layer 177 of the light emitting device 150 can be disposed farther from the portion 210a of the blocking member 210 than the first and second insulating layers 175 and 176.

The first metal layer 177 of the light emitting device 150 can be disposed in the second region 212 of the assembly hole 203.

When the first metal layer 177 of the light emitting device 150 is assembled to the assembly hole 203, since the first metal layer 177 is exposed to the outside, for example, the first connection electrode (213 in FIG. 10) can be directly electrically connected to the first metal layer 177 and the electrical connection structure can be simple.

The first metal layer 177 can be an electrode for supplying voltage. The first metal layer of the embodiment can surround not only the second metal layer but also the second conductivity-type semiconductor layer. That is, since the first metal layer is in contact with the side surface of the second metal layer as well as the second conductivity-type semiconductor layer, since the current according to the voltage is supplied to the second conductivity-type semiconductor layer via the second metal layer and directly flows from the first metal layer to the second conductivity-type semiconductor layer, light efficiency can be improved by generating more holes in the second conductivity-type semiconductor layer.

The first metal layer 177 of the light emitting device 150 can be in surface contact with the first insulating member 205 in the assembly hole 203.

Since the lower surface of the light emitting device 150 including the first conductivity-type semiconductor layer 171 and the first metal layer 177 is in surface contact within the assembly hole 203, compared to the cylindrical light emitting device 150, much more stable assembly in the assembly hole 203 is possible.

Since the blocking member 210 is formed on the first insulating member 205, a step can be generated between the first insulating member 205 and the blocking member 210 within the assembly hole 203. In this case, the upper surface of the light emitting device 150 can be parallel to the upper surface of the substrate 200 by making the thickness t2 of the first metal layer 177 the same as the thickness t1 of the blocking member 210. Accordingly, a uniform beam angle of light can be obtained and uniform luminance can be secured in each of the sub-pixels PX1, PX2, and PX3.

As shown in FIG. 11, when the width of a portion 210a of the blocking member 210 is T3, the width T3 of the portion 210a of the blocking member 210 can overlap 0.5 to 1 time the thickness (T1 of FIG. 13) of the first conductive semiconductor layer 171 of the light emitting device 150. For example, the width T3 of the portion 210a of the blocking member 210 can overlap by 0.5 times the thickness (T1 of FIG. 13) of the first conductive semiconductor layer 171 of the light emitting device 150. For example, the width T3 of the portion 210a of the blocking member 210 can overlap one time the thickness (T1 of FIG. 13) of the first conductive semiconductor layer 171 of the light emitting device 150.

The width T3 of the portion 210a of the blocking member 210 can be greater than the length (L of FIG. 16) of the first metal layer 177 of the light emitting device 150. The area of the portion 210a of the blocking member 210 within the assembly hole 203 is enlarged as much as possible so that dielectrophoretic force is not formed and dielectric migration force is formed only as much as the length of the first metal layer 177 (L in FIG. 16) of the light emitting device 150, thereby improving assembly direction control performance of the light emitting device 150.

Meanwhile, since the size of the light emitting device 150 assembled in the assembly hole 203 is smaller than the size of the assembly hole 203, spaces spaced apart from each other can be formed between the light emitting device 150 and inner surfaces of the assembly hole 203. This separation space can be filled with another insulating member. For example, the separation space can be filled with a resin material such as epoxy, but is not limited thereto. For example, the upper surface of the insulating member filling the separation space can have the same height as the upper surface of the second insulating member 206.

Meanwhile, the light emitting device 150 can be electrically connected to an external electrode while emitting light of the light emitting device 150.

The display device according to the embodiment can include a first connection electrode 213 and a second connection electrode 214.

As shown in FIGS. 10 and 14, the first connection electrode 213 can connect the first wiring line 201 and the first metal layer 177 of the light emitting device 150 through the first contact hole 215. After forming the first contact hole 215 by locally removing the second insulating member 206 and the first insulating member 205 using an etching process, the first connection electrode 213 can be formed in the first contact hole 215 and from above the first contact hole 215 to a part of the upper surface of the first metal layer 177 of the light emitting device 150.

As shown in FIGS. 10 and 15, the second connection electrode 214 can connect the second wiring line 202 and the first conductivity-type semiconductor layer 171 of the light emitting device 150 through the second contact hole 216. After forming the second contact hole 216 by locally removing the second insulating member 206 and the first insulating member 205 using an etching process, the second connection electrode 214 can be formed from within the second contact hole 216 and over the sixth contact hole 216 to a portion of the upper surface of the first conductivity-type semiconductor layer 171 of the light emitting device 150.

The first connection electrode 213 and the second connection electrode 214 can be made of a metal material.

Therefore, voltage is applied to the light emitting device 150 through the first wiring line 201, the second wiring line 202, and the first and second connection electrodes 213 and 214, the corresponding light emitting device 150 can emit light.

Although not shown, the first connection electrode 213 can be electrically connected to the second wiring line 202, and the second connection electrode 214 can be electrically connected to the first wiring line 201.

According to the embodiment, when the first wiring line 201 and the second wiring line 202 are self-assembled, a dielectrophoretic force can be generated, and a voltage can be applied to the light emitting device 150 during driving.

Alternatively, the first wiring line 201 and the second wiring line 202 can be used only to generate a dielectrophoretic force during self-assembly. Separate voltage lines for applying voltage to the light emitting device 150 can be provided. In this case, the first voltage line and the second voltage line can be disposed on the second insulating member 206, and the first voltage line and the second voltage line can be directly electrically connected to the light emitting device 150, respectively. Alternatively, the first voltage line and the second voltage line can be electrically connected to the light emitting device 150 via the first and second connection electrodes 214.

The above detailed description should not be construed as limiting in all respects and should be considered as illustrative. The scope of the embodiments should be determined by reasonable interpretation of the appended claims, and all changes within the equivalent range of the embodiments are included in the scope of the embodiments.

INDUSTRIAL APPLICABILITY

The embodiment can be adopted in the field of display displaying images or information.

The invention claimed is:

1. A display device comprising:
a substrate;
a first wiring line on the substrate;
a second wiring line on the substrate;
a first insulating member on the first wiring line and the second wiring line;
a blocking member disposed across the first wiring line and the second wiring line;
a second insulating member comprising a plurality of assembly holes; and
a plurality of light emitting devices disposed in each of the plurality of assembly holes,
wherein each of the plurality of assembly holes comprises
a first region close to the blocking member and a second region farther from the blocking member than the first region, wherein a part of the blocking member is disposed in the first region of an assembly hole, and
wherein each of the plurality of light emitting devices comprises:
a first conductivity-type semiconductor layer;
an active layer on the first conductivity-type semiconductor layer;
a second conductivity-type semiconductor layer on the active layer;
a first and second insulating layers on at least both side surfaces of the first conductivity-type semiconductor layer; and
a first metal layer surrounding at least the second conductivity-type semiconductor layer.

2. The display device according to claim 1, wherein the first insulating layer overlaps a portion of the first wiring line in the assembly hole and the second insulating layer overlaps a portion of the second wiring line in the assembly hole.

3. The display device according to claim 1, wherein a thickness of the first metal layer is equal to a thickness of the blocking member.

4. The display device according to claim 1, wherein the first and second insulating layers are disposed on at least both side surfaces of each of the active layer and the second conductivity-type semiconductor layer, and
wherein the first metal layer is disposed on the first and second insulating layers.

5. The display device according to claim 1, wherein the first and second insulating layers of a light emitting device are disposed in the first region of the assembly hole.

6. The display device according to claim 1, wherein the first and second insulating layers of a light emitting device are configured to be in contact with the part of the blocking member in the assembly hole.

7. The display device according to claim 1, wherein the first metal layer of a light emitting device is disposed farther from a portion of the blocking member than the first and second insulating layers.

8. The display device according to claim 1, wherein the first metal layer of a light emitting device is disposed in the second region of the assembly hole.

9. The display device according to claim 1, wherein the first metal layer of a light emitting device is configured to be in contact with the first insulating member in the assembly hole.

10. The display device according to claim 1, wherein a width of the part of the blocking member overlaps 0.5 to 1 time a thickness of the first conductivity-type semiconductor layer of a light emitting device.

11. The display device according to claim 1, wherein a width of the part of the blocking member is greater than a length of the first metal layer of a light emitting device.

12. The display device according to claim 1, wherein the first conductivity-type semiconductor layer of a light emitting device is disposed on the first region of the assembly hole, and
wherein the second conductivity-type semiconductor layer of the light emitting device is disposed on the second region of the assembly hole.

13. The display device according to claim 1, wherein the blocking member comprises a metal material.

14. The display device according to claim 1, further comprising:
a first connection electrode connecting the first wiring line and the first metal layer of a light emitting device through a first contact hole; and a second connection electrode connecting the second wiring line and the first conductivity-type semiconductor layer of the light emitting device through a second contact hole.

15. The display device according to claim 1, wherein a light emitting device comprises one of a plate light emitting device, a cylindrical light emitting device, a disk light emitting device, a micro light emitting device, a nano light emitting device, or a rod light emitting device.

16. The display device according to claim 1, wherein a thickness of the first metal layer is equal to or greater than a thickness of the blocking member.

17. The display device according to claim 1, further comprising a second metal layer on the second conductivity-type semiconductor layer.

18. The display device according to claim 17, wherein the second metal layer comprises a magnetic material.

19. The display device according to claim 17, wherein the first metal layer is configured to surround the second metal layer.

20. The display device according to claim 17, wherein a sum of thicknesses of the second conductivity-type semiconductor layer and the second metal layer is equal to a thickness of the first conductivity-type semiconductor layer.

* * * * *